US009717119B2

(12) United States Patent
Rodinger et al.

(10) Patent No.: US 9,717,119 B2
(45) Date of Patent: Jul. 25, 2017

(54) LED LIGHT WITH THREE-DIMENSIONAL POLYHEDRON PRINTED CIRCUIT BOARD

(71) Applicants: Tomas Rodinger, Vancouver (CA); Gimmy Chu, Mississauga (CA); Christian Yan, Scarborough (CA)

(72) Inventors: Tomas Rodinger, Vancouver (CA); Gimmy Chu, Mississauga (CA); Christian Yan, Scarborough (CA)

(*) Notice: Subject to any disclaimer, the term of this patent is extended or adjusted under 35 U.S.C. 154(b) by 529 days.

(21) Appl. No.: 14/152,928

(22) Filed: Jan. 10, 2014

(65) Prior Publication Data

US 2014/0292192 A1    Oct. 2, 2014

Related U.S. Application Data

(63) Continuation of application No. 29/445,982, filed on Feb. 19, 2013, now Pat. No. Des. 706,960.
(Continued)

(30) Foreign Application Priority Data

Mar. 26, 2013 (CN) .......................... 2013 1 0100381

(51) Int. Cl.
*H05B 33/08* (2006.01)
*F21V 29/00* (2015.01)
(Continued)

(52) U.S. Cl.
CPC ......... *H05B 33/0806* (2013.01); *F21K 9/232* (2016.08); *F21V 29/004* (2013.01);
(Continued)

(58) Field of Classification Search
None
See application file for complete search history.

(56) References Cited

U.S. PATENT DOCUMENTS

| 6,440,775 B2 | 8/2002 | Khoury |
| 7,872,278 B2 | 1/2011 | Stoyan |

(Continued)

FOREIGN PATENT DOCUMENTS

| CN | 201100601 Y | 8/2008 |
| CN | 201487607 U | 5/2010 |

(Continued)

OTHER PUBLICATIONS

HK 1179104A Search Report for Hong Kong Short-Term Patent Application, Apr. 9, 2013.
PCT/CA2014000012 International Search Report and Written Opinion, dated Apr. 30, 2014.

*Primary Examiner* — Douglas W Owens
*Assistant Examiner* — Laura Yesildag
(74) *Attorney, Agent, or Firm* — Norton Rose Fulbright Canada LLP

(57) ABSTRACT

An LED bulb comprises a structural shell formed by folding a flat PCB into a three-dimensional polyhedron shape and a fitting for removably coupling the bulb to a light socket. The PCB comprises a plurality of LEDs, at least one LED mounted electronically on a plurality of faces of the polyhedron, and a driver circuit for driving each LED. The perimeter of the PCB is shaped to join adjacent faces. Each LED produces minimal excess heat, which is partially conducted by a metallic heat sink bridge to the PCB and dissipated to the air through the PCB and through a plurality of spaces in the shell.

32 Claims, 24 Drawing Sheets

Related U.S. Application Data

(60) Provisional application No. 61/766,291, filed on Feb. 19, 2013.

(51) Int. Cl.
*H05K 1/02* (2006.01)
*F21K 9/232* (2016.01)
*F21Y 101/00* (2016.01)
*F21Y 115/10* (2016.01)
*F21Y 107/40* (2016.01)

(52) U.S. Cl.
CPC ..... *H05B 33/0803* (2013.01); *H05B 33/0815* (2013.01); *H05K 1/0278* (2013.01); *F21Y 2101/00* (2013.01); *F21Y 2107/40* (2016.08); *F21Y 2115/10* (2016.08); *H01L 2924/0002* (2013.01); *H05K 2201/047* (2013.01); *H05K 2201/09036* (2013.01); *H05K 2201/09063* (2013.01); *H05K 2201/10106* (2013.01); *H05K 2203/0228* (2013.01); *Y02B 20/348* (2013.01)

(56) References Cited

U.S. PATENT DOCUMENTS

| | | |
|---|---|---|
| 8,047,679 B2 | 11/2011 | Wu et al. |
| 2007/0047243 A1 | 3/2007 | Hacker et al. |
| 2011/0089830 A1 | 4/2011 | Pickard et al. |
| 2011/0298371 A1 | 12/2011 | Brandes et al. |
| 2012/0113640 A1* | 5/2012 | Markle ............... F21S 8/04 362/249.02 |
| 2012/0187862 A1 | 7/2012 | Britt et al. |
| 2012/0257374 A1 | 10/2012 | Daniel |
| 2013/0010460 A1 | 1/2013 | Peil et al. |
| 2015/0116996 A1* | 4/2015 | Dent ............... F21K 9/90 362/227 |

FOREIGN PATENT DOCUMENTS

| | | |
|---|---|---|
| CN | 201795398 U | 4/2011 |
| GB | 2484152 A | 4/2012 |

* cited by examiner

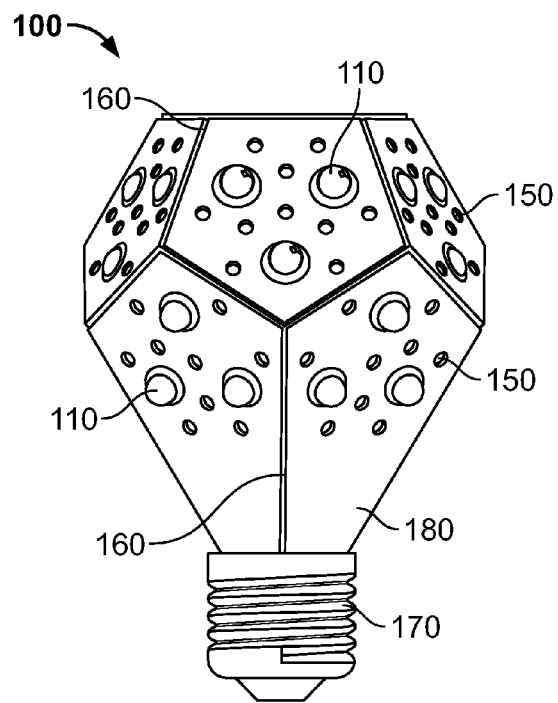
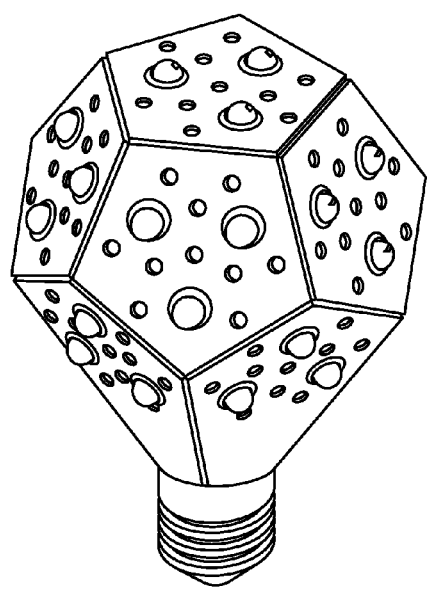
FIG. 4A
FIG. 4B
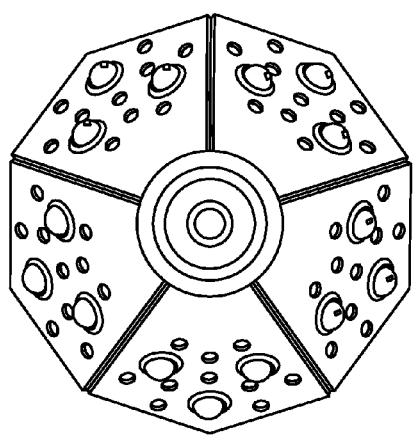
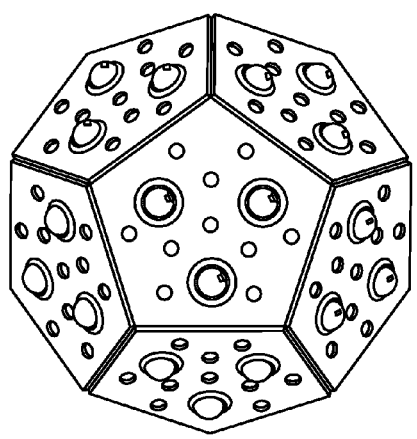
FIG. 4C
FIG. 4D

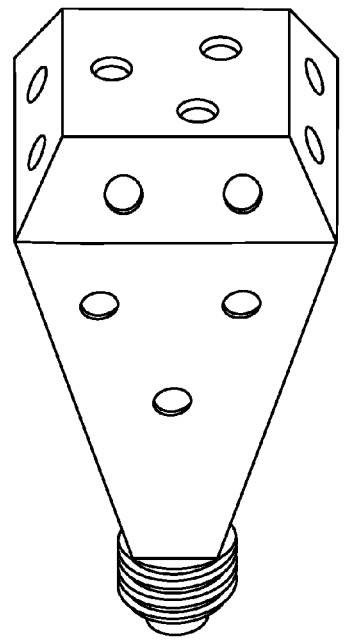 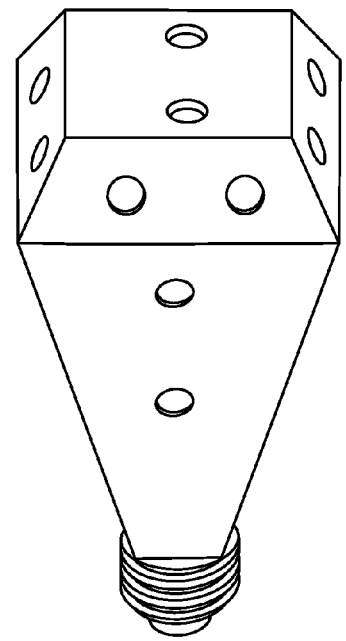
FIG. 8M　　　　　　　　　　　FIG. 8N
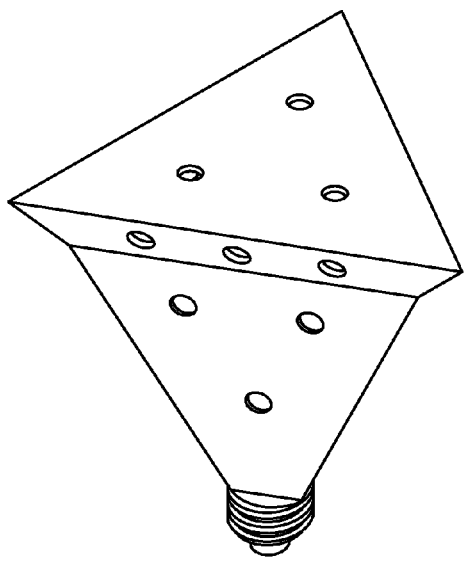 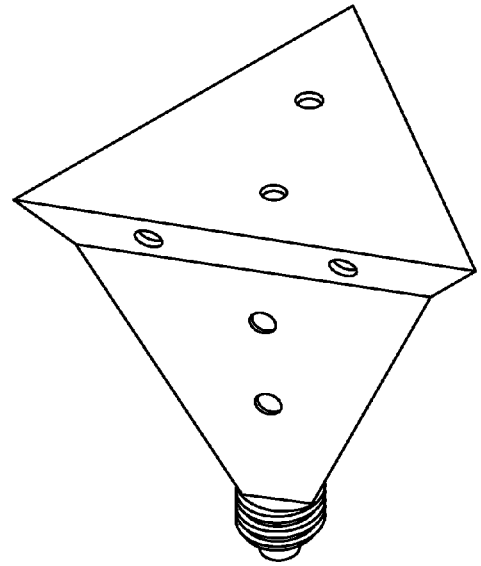
FIG. 8O　　　　　　　　　　　FIG. 8P

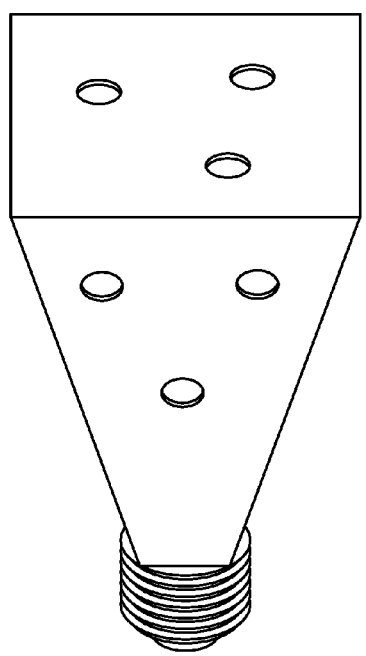
FIG. 8SS
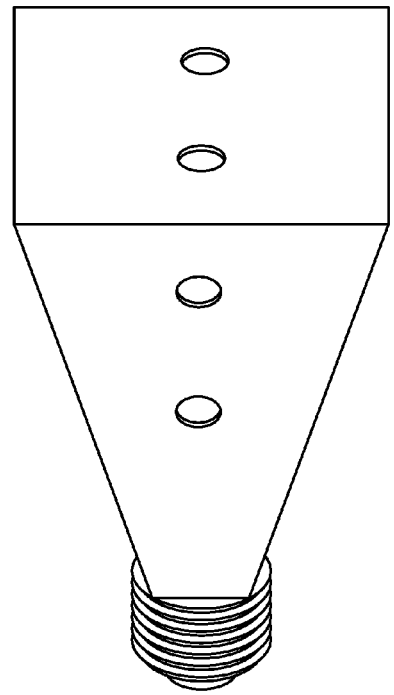
FIG. 8TT
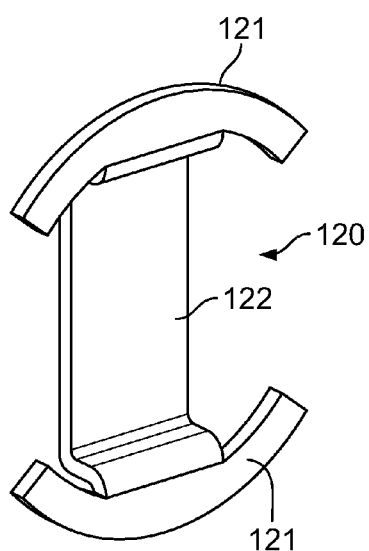
FIG. 9A
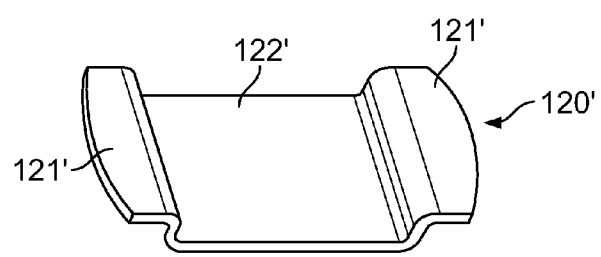
FIG. 9B(i)
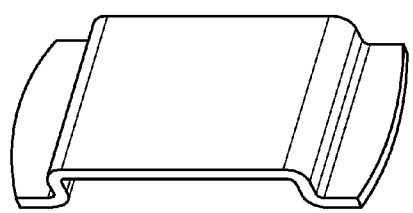
FIG. 9B(ii)

LED LIGHT WITH THREE-DIMENSIONAL POLYHEDRON PRINTED CIRCUIT BOARD

CROSS REFERENCE TO RELATED APPLICATIONS

This application claims the benefit of U.S. Provisional Patent Application 61/766,291 filed on Feb. 19, 2013 and U.S. Design patent application Ser. No. 29/445,982 filed on Feb. 19, 2013. This application also claims the benefit of Chinese Patent Application 201310100381.6 filed Mar. 26, 2013.

TECHNICAL FIELD

The present invention generally relates to an LED (light emitting diode) illumination device, and more particularly, to a light bulb which is fabricated by folding a two-dimensional printed circuit board (PCB) with LEDs mounted thereon into a three-dimensional structure. The three dimensional structure is configured to fit into a standard light fitting.

BACKGROUND OF THE INVENTION

LED lighting has gradually gained traction in a market once dominated by traditional lighting products such as incandescent light bulbs due to several advantages, including lower energy consumption and higher brightness. The development of LED lighting technology still has challenges, including energy consumption and heat dissipation.

Many LED lights are disclosed in the prior art. For example, Chinese Patent Publication No. 101749675A and United Kingdom Patent Publication No. 2467027 disclose an LED light assembly which includes a plurality of LED PCBs, with each PCB having at least one LED bulb and electrical connector pads configured at each opposite end of the boards. At least one electrical connector is configured to connect one end of a first PCB to an end of a second PCB such that the first and second PCBs are electrically connected to each other. This type of assembly is placed in structures which connect to lighting fixtures designed for conventional fluorescent lighting. The publications disclose that a plurality of LEDs can be mounted on a PCB, and multiple PCBs can be joined by connectors to form an LED light. This is a change from traditional lighting assemblies. Mass production of this kind of LED light is difficult due to its costly manufacturing processes and assembly.

Chinese Patent Publication No. 102506338A discloses an LED strip which comprises a PCB and a plurality of LEDs mounted on the PCB; a heat sink mounted on the back of the PCB; and a heat conductive adhesive disposed between the PCB and the heat sink fin. Fins protrude from the heat sink. The publication discloses how to mount an LED on a PCB with a heat sink and radiating fins to form a striped LED lamp. The heat dissipation characteristics were not disclosed and so the efficiency of the system is unknown.

Underutilizing the maximum rated drive current of an LED is referred to as underdriving the current. For example, an LED which has a normal power consumption of 1 watt (W) may yield 120 lumens. If less current is driven through the same circuit, the power used by the LED as well as the lumen output will be reduced. As current is decreased, power will decrease faster than lumen output. For example, the same LED operated at half power or 0.5 W may produce 70 lumens. Therefore, this known technique, yields a better electricity to light output conversion efficiency. More LEDs need to be added to the circuit in order to achieve the desired lumen output. Underdriving the LEDs does not use LEDs to their maximum lumen potential. As such, while less power will be required to achieve the same lumen output, the light will employ more LEDs, which is more expensive. Because of the higher operating efficiency of the individual LEDs, the total amount of heat dissipated is reduced.

Overutilizing the maximum rated drive current of an LED is referred to as overdriving the current. Most prior art LED lighting overdrives the LEDs which requires less LEDs per light and increases heat dissipation challenges, which are resolved with fans and complex heat fin systems. Significantly, overdriving LEDs reduces the luminous efficacy or efficiency of the light, measured as lumens per watt (lm/W), since a higher current is driven through an LED which is rated for a relatively lower normal rating. Furthermore, overdriving the LEDs will reduce their useful operating life, sometimes significantly if heat dissipation is not accordingly enhanced.

Generally most indoor and task lighting has a Correlated Color Temperature (CCT) in the range of 2,700-4,000 K and a Color Rendering Index (CRI) of at least 70 or higher. A traditional incandescent 100 W A19 light bulb in this color temperature range produces about 1,600 lumens of light, with an efficiency of 16 lm/W. Compact fluorescent lights (CFL) which produce the same amount of light yield at about 66 lm/W. Equivalent prior art LED lights yield about 70 to 80 lm/W.

Governments are incentivizing the development of more efficient lighting solutions. In 2011, the United States Department of Energy awarded the L Prize™ for a very efficient 60 W replacement LED light to Philips Lighting North America. The Philips award-winning LED light consumes 9.7 W and has a light output of 910 lumens and color temperature of 2,727 K, yielding an efficiency of about 94 lm/W. That light bulb has been discontinued from the market and replaced with lower efficiency variants. By the end of 2014, the Government of Canada will have banned sales of most standard incandescent light bulbs in favour of more efficient lighting.

Manufacturers have experienced much difficulty in improving the efficiency of 100 W replacement LED bulbs, in part due to the heat dissipation problems. In 2011, Osram Sylvania announced a laboratory result for a 100 W replacement LED light achieving 1,500 lumens with 14 W, yielding 107 lm/W in the color temperature range of 2,700 K.

There is a need for a more efficient light with acceptable CCT and CRI and having at least a 1,600 lumen output. There is also a need to improve LED lighting to provide more efficient lighting and better heat dissipation characteristics to minimize energy consumption.

SUMMARY OF THE INVENTION

An LED light is provided which comprises a structural shell made of a PCB which is folded into a three-dimensional shape. The folded PCB has a plurality of outer faces, a plurality of corresponding inner faces and an open end configured to accept a light fitting. The light fitting is joined to the folded PCB at the open end and is configured to removably couple the light to a light fixture. A plurality of LEDs is mounted electronically on the PCB, each one through a hole in the PCB. Each LED is connected to a driver circuit on the inner face of the PCB and protrudes through the outer face of the PCB. The driver circuit provides power to each LED and is electronically coupled to the light fitting.

The LED light has a generally closed three-dimensional shape which permits heat to dissipate from inside the shape through the PCB.

Each of the faces of the PCB comprises an outer face and a corresponding inner face, the PCB comprising at least three layers, including at least one outer non-conductive layer and at least one internal conductive layer.

A plurality of bending lines is cut partially, but not all the way, through the at least one outer non-conductive layer of the PCB, at a sufficient depth to allow partial bending of the PCB at one or more angles along the bending lines so as to facilitate folding of the PCB into a generally polyhedron shape, while maintaining the integrity of the at least one internal conductive layer. In one embodiment, at least one internal conductive layer of the PCB is copper. The bending lines are precut by a laser-cutting apparatus such as those known in the art.

Depending on the form of the polyhedron shape, one or more angles between two adjacent shapes is within the range of 1 to 90 degrees. In one embodiment, where the PCB has eleven sides and one open end, the one or more angles is about 63 degrees.

To facilitate assembly, at least part of a perimeter of the PCB is shaped to interlock adjacent faces to each other. In one embodiment, a first outer face has a first set of edge teeth, and at least part of the perimeter of a second outer face has a second set of edge teeth, the first and second outer faces being adjacent to each other, the second set of edge teeth being complementary to the first set of edge teeth.

Furthermore, in order to facilitate connection of the PCB to the light fitting, the light fitting is engagingly connected to at least part of a perimeter of the plurality of faces of the PCB, the part having a third set of edge teeth to complementarily engage internal components of the light fitting. Various light fittings can be connected to the assembled PCB template, such as a standard Edison fitting, bayonet mount or wedge base.

In some embodiments, one or more of the faces of the three-dimensional shape is a polygon chosen from the group consisting of a triangle, a quadrilateral, a pentagon and a hexagon. In other embodiments, one face of the three-dimensional shape comprises several parts of the PCB folded to complement each other without overlap and together form the one assembled outer face.

In some embodiments, all parts of the PCB comprise at least one LED. In other embodiments, at least one, but not all of the several parts of the PCB comprises an LED.

At least one of the several faces electronically engages with internal components of the light fitting. At least three of the several faces mechanically engage with and are secured to the internal components of the light fitting. The mechanical engagement can further be secured with adhesive applied to at least one of the faces and the light fitting.

In some embodiments, three or more angles between the faces are about the same.

The polyhedron shape comprises at least four faces and an open end. In some embodiments, the polyhedron has up to twenty faces and an open end. In other embodiments, the polyhedron has eleven faces and an open end. Some polyhedron shapes of the present invention are Platonic solids, whereas others are irregular polyhedrons.

In one embodiment, an additional non-conductive plate, such as a non-energized PCB, is shaped and dimensioned to the one assembled outer face, the plate is adhered to the parts of the one assembled outer face and comprises one or more holes configured to accept the one or more LEDs therethrough. The one assembled outer face comprises an outer face and a corresponding inner face, the plate being adhered to the inner face.

In certain embodiments, one of the first or second set of edge teeth comprises a groove, the groove comprising a cut into the perimeter of the PCB at about ninety degrees to the perimeter for at least about the thickness of the PCB, the cut then extending about ninety degrees parallel to the perimeter at about a width of the other of the second or first set of edge teeth, the cut then returning to the perimeter of the PCB at about ninety degrees. Optionally, there is at least one ventilation space cut out of the PCB at about the right angle junctions formed therein.

Some lights of the present invention comprise one LED on at least two faces, two LEDs per face, three LEDs per face, four LEDs per face, five LEDs per face or a combination of one, two, three, four or five LEDs per face. The folded 3-D shape has a plurality of faces.

In one embodiment, the light fitting is an Edison screw and the light is sized to be about 3 inches wide at its widest point and about 4.3 inches in length from the PCB to the end of the fitting, the Edison screw having a base of about 1 inch in diameter. This particular light weighs about 85 g.

Optionally, the LED light comprises a temperature sensor electronically connected to the driver circuit and configured to sense a temperature condition within the three-dimensional shape upon which the driver circuit lowers the current of the circuit to prevent circuit or LED overheating and failure.

The LED light further comprises a pulse-width modulation controller IC electronically connected to the driver circuit for regulating current to the plurality of LEDs.

In addition, there is provided a heat dissipation system in an LED light, comprising a structural shell comprising a PCB folded into a three-dimensional shape, the shape comprising several faces and one open end configured to accept a light fitting and a light fitting joined to the open end, the light fitting for removably coupling the light to a light fixture. The PCB comprises several LEDs mounted electronically thereon, each of the LEDs mounted through a hole in the PCB and electronically connected to a face and a driver circuit, the driver circuit electronically coupled to the light fitting. Heat generated from the powered LEDs is partially dissipated inward by conduction to the PCB and outward to the environment by convection.

Each of the faces comprises an outer face and a corresponding inner face. The PCB comprises at least three layers, including at least one outer non-conductive layer and at least one internal conductive layer, the internal conductive layer conducting the heat from the LEDs throughout the PCB. For example, the PCB can comprise an internal conductive copper layer sandwiched between outer and internal non-conductive fibreglass layers. In addition, paint can be applied to each of the external and internal fibreglass layers. Component markings can be applied to the internal paint layer. A design or other etching can be applied to the external paint layer.

In one embodiment, the heat dissipation system further comprises several heat-conductive components, each of the conductive components thermally joined to the internal conductive layer and inner face.

In another embodiment, the heat dissipation system further comprises several heat sinks, each of the heat sinks being in contact with a heat pad of each of the LEDs and coupled to at least one conductive component. Each heat sink comprises metal chosen from the group consisting of copper and aluminum. Each heat sink is coupled to the heat pad of each LED with heat conductive silicone or solder. Furthermore, each heat sink is coupled to at least one conductive component with heat conductive silicone or solder.

In one embodiment, each of the heat sinks comprises two connecting portions, for contacting the heat sink to the exposed pads, a contacting portion for contacting the heat sink to a heat pad of each LED and two joining portions, for joining the contacting portion to the connecting portions. Each of the two connecting portions, contacting portion and two joining portions are thermally conductive to partially dissipate heat from the heat pad to the exposed pads, the two exposed pads further partially conducting heat to the internal conductive layer, the internal conductive layer further partially dissipating the heat outward to the environment. In one embodiment, the connecting portions, contacting portion and joining portions of each of the heat sinks consist of one piece of stamped metal.

The connecting portions are about the same width as the joining portions in some embodiments, while in others, the connecting portions have a bigger width than the width of the joining portions. In other embodiments, one or more of the connecting portions, contacting portion and joining portions are fin-shaped to provide additional surface area for each heat sink.

Optionally, the heat dissipation system further comprises several spaces shaped in at least part of a perimeter of the PCB to further allow heat to dissipate from within the three-dimensional shape to the environment. Some of the spaces can be ventilation spaces milled or drilled in the PCB to further allow heat to dissipate from inside the three-dimensional shape to the environment, each of the one or more ventilation spaces sized to prevent insertion of a probe of at least 2 mm in diameter.

There is further disclosed a PCB template configured to be assembled into an LED bulb, the bulb having a three-dimensional shape and connected to a light fitting, the PCB template comprising at least three layers, comprising one outer non-conductive layer and at least one internal conductive layer, a plurality of holes in the PCB template, a plurality of LEDs mounted on the PCB template, each of the plurality of holes sized to complementarily fit each of the plurality of LEDs, a plurality of exposed pads, each of the plurality of exposed pads thermally joined to the at least one internal conductive layer, each of the plurality of LEDs protruding out the outer non-conductive layer and electronically connected to a pair of the plurality of exposed pads, and a driver circuit electronically disposed on the at least one inner conductive layer and connected to each of the plurality of LEDs, the driver circuit configured to convert an incoming voltage to a lower voltage sufficient to drive each of the plurality of LEDs.

The PCB template may further comprise a temperature sensor electronically connected to the circuit and configured for lowering the circuit current on the occurrence of a sensed temperature condition to prevent circuit failure.

The PCB template may further comprise a pulse-width modulation controller IC electronically connected to the circuit for regulating current to the plurality of LEDs.

The PCB template comprises interlocking complementary edge teeth along a plurality of sides of the template's perimeter. The template is shaped as a flat, unfolded polyhedron, such as an unfolded dodecahedron having eleven PCB faces and one open face. A plurality of bending lines is precut partially, but not all the way, through the outer non-conductive layer of the PCB template, at a sufficient depth to allow partial bending of the PCB template at one or more angles along the plurality of bending lines so as to facilitate folding of the PCB template into a polyhedron shape, folded close, while maintaining the integrity of the at least one internal conductive layer.

In one embodiment, the PCB template comprises fifteen shapes defined by a plurality of bending lines, five of the shapes having five sides each, five of the shapes having six sides each and the remaining five shapes having at least three sides each. The first, third, fifth, seventh and ninth shapes each have five sides and are of the same general dimensions The second, fourth, sixth, eight and tenth shapes each have six sides and are of the same general dimensions. The eleventh, twelfth, thirteenth, fourteenth and fifteenth shapes each have a geometry configured to together form an assembled sixteenth shape, the assembled sixteenth shape being of the same general dimensions as the first, third, fifth, seventh and ninth shapes. The first five-sided shape has a common side with a side of the second six-sided shape. The second six-sided shape has a common side with a side of the third five-sided shape, the two common sides of the second six-sided shape being adjacent sides. The third five-sided shape has a common side with a side of the fourth six-sided shape, the two common sides of the third five-sided shape being adjacent sides without overlapping any shape. The fourth six-sided shape has a common side with a side of the fifth five-sided shape, the two common sides of the fourth six-sided shape being adjacent sides without overlapping any shape. The fifth five-sided shape has a common side with a side of the sixth six-sided shape, the two common sides of the fifth five-sided shape being adjacent sides without overlapping any shape. The sixth six-sided shape has a common side with a side of the seventh five-sided shape, the two common sides of the sixth six-sided shape being adjacent sides without overlapping any shape. The seventh five-sided shape has a common side with a side of the eighth six-sided shape, the two common sides of the seventh five-sided shape being adjacent sides without overlapping any shape. The eighth six-sided shape has a common side with a side of the ninth five-sided shape, the two common sides of the eighth six-sided shape being adjacent sides without overlapping any shape. The ninth five-sided shape has a common side with a side of the tenth six-sided shape, the two common sides of the ninth five-sided shape being adjacent sides without overlapping any shape. The first, third, fifth, seventh and ninth shapes each having a common side with a respective side of the eleventh, twelfth, thirteenth, fourteenth and fifteenth shapes without overlapping any shape. Finally, the second, fourth, sixth, eight and tenth shapes each having a tail extending from one side in the same direction without overlapping any shape, each tail having one side being an extension of one side of each of the second, fourth, sixth, eight and tenth shapes and a shorter sixth side extending outward without overlapping any shape. Each tail has fitting teeth protruding from each of the sixth sides.

In another embodiment, a PCB template configured to be assembled into a closed three-dimensional shape is described, wherein the shape is connected to a power source, the PCB template comprising at least three layers, comprising one outer non-conductive layer and at least one internal conductive layer, a plurality of holes drilled or milled through the PCB template, a plurality of LEDs mounted on the PCB template, each of the plurality of holes sized to complementarily fit each of the plurality of LEDs, a plurality of exposed pads, each of the plurality of exposed pads thermally joined to the at least one internal conductive layer, each of the plurality of LEDs protruding out the outer non-conductive layer and electronically connected to at least one of the plurality of exposed pads, and a driver circuit electronically disposed on the at least one inner conductive layer and connected to each LED, the driver circuit configured to convert an incoming voltage to a lower voltage sufficient to drive the plurality of LEDs. The PCB template can have a shape such as recognizable shapes and abstract shapes.

A method of assembling a PCB template into an LED light is also provided, comprising folding the common side of the twelfth shape and the third five-sided shape to about an angle of 117 degrees between the two shapes, folding the respective common sides of the ninth and ten shapes, eighth and ninth shapes, seventh and eighth shapes, sixth and seventh shapes, fifth and sixth shapes, fourth and fifth shapes, third and fourth shapes, and second and third shapes, each at about an angle of 117 degrees between the respective two shapes, aligning and interlocking the edge teeth of respective complementary sides of the eighth to the tenth shape, the sixth to the eighth shape, the fourth to the sixth shape, the second to the fourth shape, the tenth to the second shape, the seventh to the ninth shape, the fifth to the seventh shape, and the third to the fifth shape, providing and coupling a light fitting to the fitting teeth on the tails of the second, fourth, sixth, eight and tenth shapes, folding the respective common sides of the fifth and thirteenth shape, seventh and fourteenth shape, and ninth and fifteenth shape, each at about an angle of 117 degrees between the respective two shapes, folding the common side of the first and second shape, aligning and interlocking the edge teeth of respective complementary sides of a first side of the first to the third shape, the ninth to a second side of the first shape and the tenth to a third side of the first shape, and folding the common side of the first and eleventh shape.

The method can further comprise providing a non-energized PCB having the same general dimension as the first, third, fifth, seventh and ninth shapes; before the step of folding the common side of the twelfth shape and the third five-sided shape, adhering the non-energized PCB to the twelfth shape with a side of the non-energized PCB aligned with the common side of the twelfth shape and the third five-sided shape; before folding the common side of the first and second shape, adhering the other side of the non-energized PCB to the thirteenth, fourteenth and fifteenth shapes; and after folding the common side of the first and eleventh shape, adhering the other side of the non-energized PCB to the eleventh shape to complete the assembled sixteenth shape.

There is also provided an LED light, comprising a structural shell comprising a plurality of LEDs mounted electronically thereon, each of the plurality of LEDs electronically connected to the shell and a driver circuit, a light fitting joined to the shell, the light fitting for removably coupling the LED light to a light fixture, the driver circuit electronically coupled to the light fitting, and a power supply electronically connected to the driver circuit and configured to provide power to the plurality of LEDs. The LED light is configured to yield light output ranging from at least 1,200 to at least 1,800 lumens. Power provided to the LED light ranges from about 10 W to about 12 W. In certain embodiments, when the power is about 10 W, the light output is at least 1,200 lumens. In other embodiments, when the power is about 12 W, the light output is at least 1,600 lumens. In still other embodiments, when the power is about 12 W, the light output is at least 1,800 lumens.

In some embodiments, each of the plurality of LEDs is rated for about 350 mA of current. In some embodiments, the same or less than the rated current is provided to each of the plurality of LEDs. About one fifth to a half, and preferably about one third, of the rated current is provided to each of the plurality of LEDs in certain embodiments (ie: the LED's are underdriven).

The LED light in some embodiments comprises eleven to fifty-five LEDs, preferably thirty-three LEDs. The shell comprises a plurality of faces and an open end, and one to five LEDs, preferably three LEDs, coupled to each of the plurality of faces.

The LED light according some embodiments has a plurality of LEDs, wherein each LED yields from about 22 to about 164 lumens, preferably in the approximate range of 36 to 55 lumens. In some embodiments, the LED light has a color rendering index of at least 70. The LED light can have a correlated color temperature in the range of 2700-6000K.

Each of the plurality of LEDs has a rated lifetime of at least 30,000 hours. Furthermore, each of the plurality of LEDs comprises a package having a silver reflective base.

The LED light can have a total weight of about 85-100 grams.

The light from the LED light embodiments of the present invention is ominidirectional, given the number of LEDs on multiple faces.

A method of optimizing the efficiency of an omnidirectional LED light is further described, comprising providing a structural shell, the shell having a plurality of sides, each side facing a different direction; providing a plurality of LEDs, at least one of the plurality of LEDs being electronically mounted on each of the plurality of sides, each of the plurality of LEDs being rated at an LED current; providing a driver circuit electronically connected to the plurality of LEDs; providing a power supply electronically connected to the driver circuit and configured to provide power to the plurality of LEDs, the power supply being about 95% efficient; and driving each of the plurality of LEDs at a driving current, the driving current being less than or equal to the rated current; the LED light yielding light output of between about 1,200 to 1,800 lumens.

According to one embodiment of the invention, a plurality of bending lines are pre-cut on the PCB for folding the PCB into a polyhedron typed PCB.

According to another embodiment of the invention, a plurality of LEDs is mounted on each face of the polyhedron typed PCB, in which the LEDs are electronically connected with the PCB.

According to another embodiment of the invention, said LED bulb further comprises a plurality of heat sinks mounted on the back of the LEDs, which conduct heat away from the LED and to the metallic surface of the PCB.

According to another embodiment of the invention, said heat sink is made of metal which is glued on the PCB by using heat conductive silicone or solder.

According to another embodiment of the invention, the PCB comprises a plurality of interlocking edges by which each face of the polyhedron can be locked to form the polyhedron typed LED bulb body.

According to another embodiment of the invention, the inner and/or outer layer of the PCB is a metal layer.

According to another embodiment of the invention, the LED bulb further comprises a plurality of holes for air flowing between the inner and outer spaces of the LED bulb body.

According to another embodiment of the invention, a thread is set on one end of the PCB so that after folding the PCB, the thread forms several teeth that allow a traditional lamp holder to be screwed on.

According to another embodiment of the invention, the polyhedron is a dodecahedron.

Accordingly, the LED bulb of the invention is structurally different from the LED bulb of the prior art, because the LED bulb of the invention uses a whole PCB with bending lines thereon to form a LED bulb body, and changes the traditional structure of the LED lamp. The LED bulb of the present invention is not easy to break, and would not result in harm to those who use it. Moreover, the LED bulb of the present invention is much more energy efficient and provides higher brightness than traditional lamps.

Each LED in the LED bulb of the present invention has a heat sink pad which cooperates with the metal layer of the PCB, preferably a copper layer, so that the heat dissipating therefrom is transferred from the LED chips to the metal layer of the PCB. This allows the PCB to act as a heat sink for the LEDs. This enables heat dissipation which is better than that of other LED bulbs, which would increase the lifetime of the LED bulb of the present invention.

In addition, by virtue of the 3-D structure of the LED bulb, such as a hendecahedron and a dodecahedron shape, the appearance of the LED bulb is more attractive which may be distributed and accepted by the market soon. And more important is that at least one LED is mounted on each face of the 3-D structured polyhedron, which would render omnidirectional light-emitting from the LED bulb, thereby obtaining better illumination in a room or a house.

The LED light of the present invention can be mass produced using known PCB fabrication methods.

BRIEF DESCRIPTION OF THE DRAWINGS

The features of the present invention, together with the advantages thereof may be best understood by reference to the following description taken in conjunction with the accompanying drawings, wherein like reference signs identify like elements, and wherein:

FIGS. 4A-D are schematic side profile, perspective, bottom and top views of the 3-D shaped LED bulb, respectively, comprising three protruding LEDs and ten ventilation spaces per face and an Edison screw fitting, according to one embodiment of the present invention;

FIG. 8AA is a schematic perspective view of another embodiment of the present invention comprising an 11-sided PCB and fitting with three or four LEDs on each of six sides;

FIG. 8BB is a schematic perspective view of another embodiment of the present invention comprising an 11-sided PCB and fitting with three LEDs on each of six sides;

FIG. 8CC is a schematic perspective view of another embodiment of the present invention comprising a 9-sided PCB and fitting with three LEDs on each of five sides;

FIG. 8DD is a schematic perspective view of another embodiment of the present invention comprising a 9-sided PCB and fitting with four LEDs on each of five sides;

FIG. 8EE is a schematic perspective view of another embodiment of the present invention comprising a 13-sided PCB and fitting with two or three LEDs per side;

FIG. 8FF is a schematic perspective view of another embodiment of the present invention comprising a 13-sided PCB and fitting with two LEDs per side;

FIG. 8GG is a schematic perspective view of another embodiment of the present invention comprising a 7-sided PCB and fitting with three LEDs per side;

FIG. 8HH is a schematic perspective view of another embodiment of the present invention comprising a 7-sided PCB and fitting with two LEDs per side;

FIG. 8II is a schematic perspective view of another embodiment of the present invention comprising an 8-sided PCB and fitting with three LEDs per side;

FIG. 8JJ is a schematic perspective view of another embodiment of the present invention comprising an 8-sided PCB and fitting with two LEDs per side;

FIG. 8KK is a schematic perspective view of another embodiment of the present invention comprising a 16-sided PCB and fitting with three LEDs per side;

FIG. 8LL is a schematic perspective view of another embodiment of the present invention comprising a 16-sided PCB and fitting with two LEDs per side;

FIG. 8MM is a schematic perspective view of another embodiment of the present invention comprising an 11-sided PCB and fitting with two LEDs per side;

FIG. 8NN is a schematic perspective view of another embodiment of the present invention comprising an 11-sided PCB and fitting with three LEDs per side, similar to the embodiment of FIGS. 7A-D but with a screw fitting;

FIG. 8OO is a schematic perspective view of another embodiment of the present invention comprising a 6-sided PCB and fitting with three LEDs per side;

FIG. 8PP is a schematic perspective view of another embodiment of the present invention comprising a 6-sided PCB and fitting with two LEDs per side;

FIG. 8QQ is a schematic perspective view of another embodiment of the present invention comprising a 4-sided PCB and fitting with three LEDs per side;

FIG. 8RR is a schematic perspective view of another embodiment of the present invention comprising a 4-sided PCB and fitting with two LEDs per side;

FIG. 8SS is a schematic perspective view of another embodiment of the present invention comprising a 5-sided PCB and fitting with three LEDs per side;

FIG. 8TT is a schematic perspective view of another embodiment of the present invention comprising a 5-sided PCB and fitting with two LEDs per side;

FIG. 9A is a schematic view of a heat sink with wide connecting portions, according to one embodiment of the present invention;

FIG. 9B(i) is a schematic first view of a heat sink with narrow connecting portions, according to one embodiment of the present invention;

FIG. 9B(ii) is a schematic second view of the heat sink of FIG. 9B(i);

DETAILED DESCRIPTION OF THE INVENTION

Figure 1:
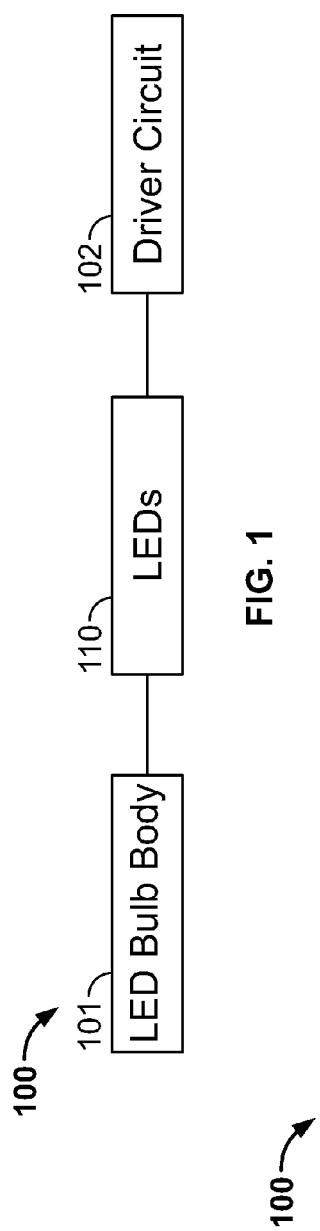
FIG. 1 is a block diagram of the LED bulb according to one embodiment of the present invention.

The following definitions are used herein:

LED means a light emitting diode and includes suitable phosphor-based white LEDs, commercially available;

LED light means an illumination device comprising at least one LED, which can take the form of a light bulb or other device which emits light;

Light fixture means a standard size fixture for a lamp, wall, ceiling or other fixture into which can be inserted a standard incandescent, compact fluorescent, or LED light bulb, regardless of the type of fitting;

Polyhedron means a three-dimensional structure having a plurality of generally flat faces and straight edges, including the five Platonic solids (tetrahedron, cube or hexahedron, octahedron, dodecahedron and icosahedron), as well as irregularly-shaped structures;

PCB means a printed circuit board comprising at least three layers, including at least one outer non-conductive layer and at least one internal conductive layer, the internal conductive layer having a dual function as a circuit and part of a heat dissipation system;

Fitting means the electrical connector component of a light bulb used to removably connect the bulb to a light fixture, including the Edison screw, the bayonet mount connector and the wedge base;

Heat sink means an energy exchanger which dissipates heat from an LED into the surrounding environment;

Bending line means a straight line cut into at least part of a PCB to allow the PCB to be folded without breaking.

The structure of the light of the invention is explained in detail with reference to the accompanying drawings. The description and explanatory embodiments herein are merely used to set forth the present invention, and not to limit the invention.

According to the present invention, an LED bulb is provided which is an energy efficient and mercury free alternative to incandescent, compact fluorescent and currently available LED light options.

The design concept of the invention is to employ a two-dimensional PCB which is folded into a three-dimensional shaped polyhedron structure along a plurality of bending lines cut thereon, the LEDs electronically connected to a pre-designed driver circuit and thermally connected to a plurality of heat sinks mounted on the PCB, so as to provide omnidirectional light. This design is configured to couple with a standard light fitting and therefore can be used with existing light fixtures, including lamps. The polyhedron described herein can include numerous sides, including polyhedrons with as few as four sides (tetrahedron) and as many as twenty sides (icosahedron) or more. In the disclosed embodiments, the folded PCB is configured to couple with a standard light fitting, so as to replace known incandescent, CFL or LED light bulbs. In many of these embodiments, the folded PCB takes a shape close to that of a known light bulb such as an A19 bulb.

It is further contemplated that the PCB of the present invention can be folded into other 3-D shapes. In this case, the disclosed power supply could be connected to a light fitting (for coupling to a lamp, for example) or another power source such as a battery or electrical connector, known in the art. In this manner, the PCB of the present invention can be folded along precut bending lines to adopt recognizable shapes, such as the shape of a cat, vehicle, the sun, letters, numbers, other symbols, etc. In addition, the folded shape can be a non-recognizable shape, such as an abstract shape. The PCB board and teaching disclosed herein can be combined with knowledge of origami, for example, to design and produce a variety of 3-D shapes, having both functional and artistic characteristics. In this broader context, the LED light which comprises a PCB as disclosed herein can be a non-traditional illumination device, in addition to a traditional light bulb illumination device.

As shown in FIG. 1, an LED light 100 of the present invention comprises an LED bulb body 101 or structural shell, a plurality of LEDs 110, and a driver circuit 102. The structural shell 101 is a two-dimensional (2-D) PCB which is folded into a three-dimensional (3-D) shape.

Figure 2:
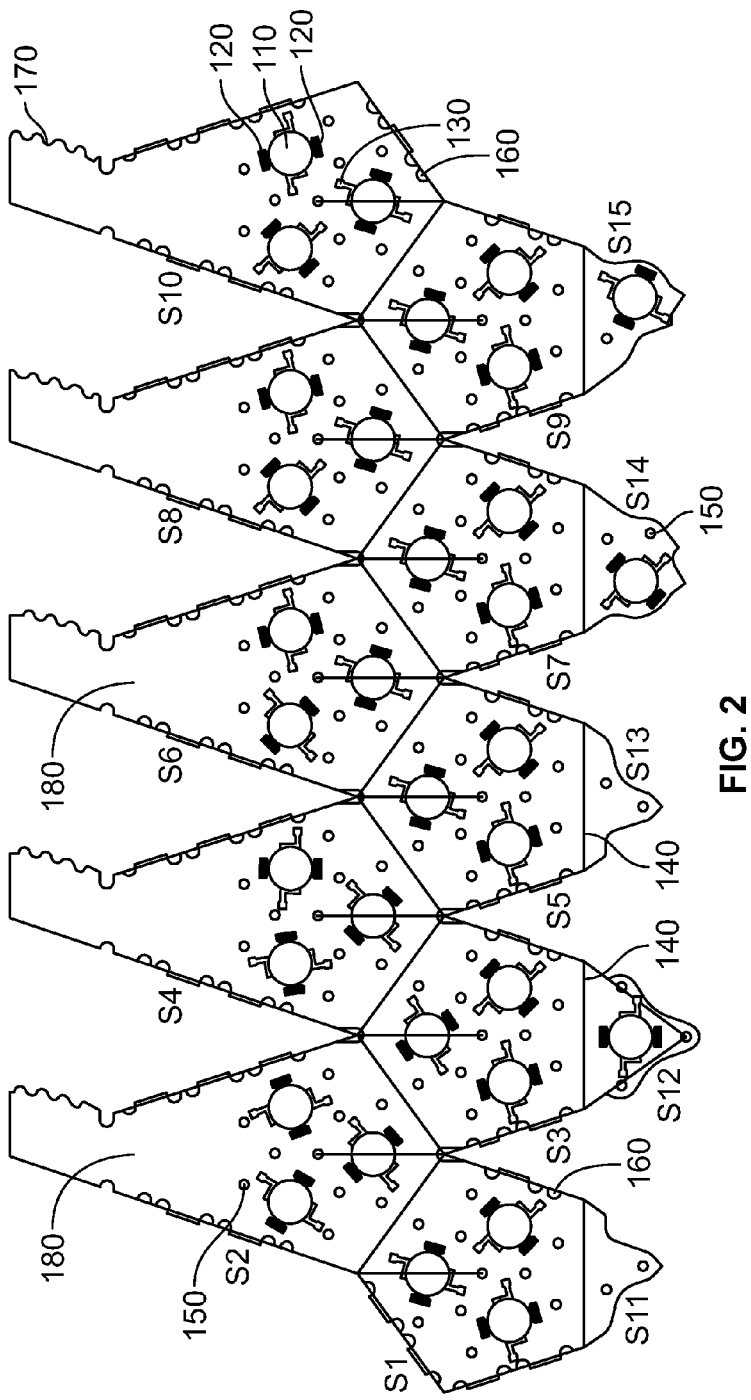
FIG. 2 is a schematic view of a two-dimensional PCB template, showing the bending lines according to one embodiment of the present invention.

FIG. 2 shows the design and structure of one embodiment of a 2-D PCB of the present invention, which has fifteen individual parts or shapes, S1-S15. Shapes S1, S3, S5, S7 and S9 are generally pentagonal, wherein each side is about the same length. Shapes S2, S4, S6, S8 and S10 have a mostly pentagonal shape with their upper tails extending to make generally six-sided shapes, the tails being shaped to couple to a light fitting as further explained below. Shapes S11, S12, S13, S14 and S15 each extend respectively from one side of shapes 51, S3, S5, S7 and S9 and have at least 3 sides each. The embodiment of FIG. 2 is a template of an 11-sided PCB, wherein the upper five sides are shapes 51, S3, S5, S7 and S9; the lower five sides are shapes S2, S4, S6, S8 and S10; and shapes S11, S12, S13, S14 and S15 together combine to make the top, eleventh shape, when folded into a 3-D structure.

When folded, the tails of shapes S2, S4, S6, S8 and S10 join together at a twelfth open end, to which is coupled a light fitting. The polyhedron formed by the PCB of FIG. 2 is therefore referred to as a dodecahedron (12-sided polyhedron) comprising eleven faces and an open end.

Generally, a PCB is made of fibreglass with a certain depth and is very rigid. In the present invention, the PCB comprises at least three layers, namely at least one internal conductive layer made of copper, sandwiched between at least two non-conductive layers generally made of FR-4 glass reinforced epoxy laminate. Other grade designations are contemplated. One type of PCB, commonly referred to as a single-layer PCB, has a single internal conductive layer, which is used in one embodiment of the invention. Multi-layer PCBs are contemplated in other embodiments of the present invention, so long as they have the bending properties as detailed below.

The internal conductive layer is coated with an oil-based paint. Optionally, for ease of manufacture and testing, a suitable legend and other writing may be applied to the paint to identify placement of circuit components. The outer non-conductive layer may be further coated with a paint of any colour, including black or white. Preferably the paint withstands heat of the reflow oven without fading or undergoing color transformation while reflow soldering the surface mount electronic components.

To fabricate the PCB in one embodiment, several steps occur. Optional ventilation holes 150 are drilled in a PCB blank. The copper is etched, leaving behind the copper areas for conduction and heat dissipation. Paint is applied to both the outer non-conductive layer (such as black or white) and the inner non-conductive layer (black). The blank is then milled or drilled to create the 2-D structure 100 shown in FIG. 2 or other shape, depending on the embodiment. The holes for the LEDs 110 are also milled at this time. The holes 110' are not shown in FIG. 2, as they each contain LEDs 110. If an artistic design, including recognizable letters, numbers or shapes, is desired on the outer non-conductive layer, it can now be laser cut into an outer non-conductive layer such as to not interfere with the operation, effectiveness or safety of the LED bulb. Bending lines are laser cut on the outer non-conductive layer at a sufficient depth to allow partial bending of the PCB at one or more angles along the plurality of bending lines so as to facilitate folding of the PCB into a generally polyhedron shape, while maintaining the integrity of the at least one internal conductive layer.

The angle of the two adjacent folded parts of the PCT is within the range of 1 to 90 degrees. In one embodiment, where the PCB has eleven sides and one open end, the one or more angles is about 63 degrees. In some embodiments, three or more angles between any pair of adjacent faces are about the same.

The outer non-conductive layer is not illustrated in the figures. The bending lines are cut to define the fifteen shapes S1-S15. The illustrated embodiment of FIG. 2 has fourteen bending lines, of which nine define the five-sided shapes S1, S3, S5, S7 and S9 from the respective adjacent six-sided shapes S2, S4, S6, S8 and S10. For example, shape S2 is defined as being adjacent shape S1 and S3, the separation being the two bending lines. When folded, the PCB bends inward along the bending lines, resulting in inner bends 140.

Figure 10:
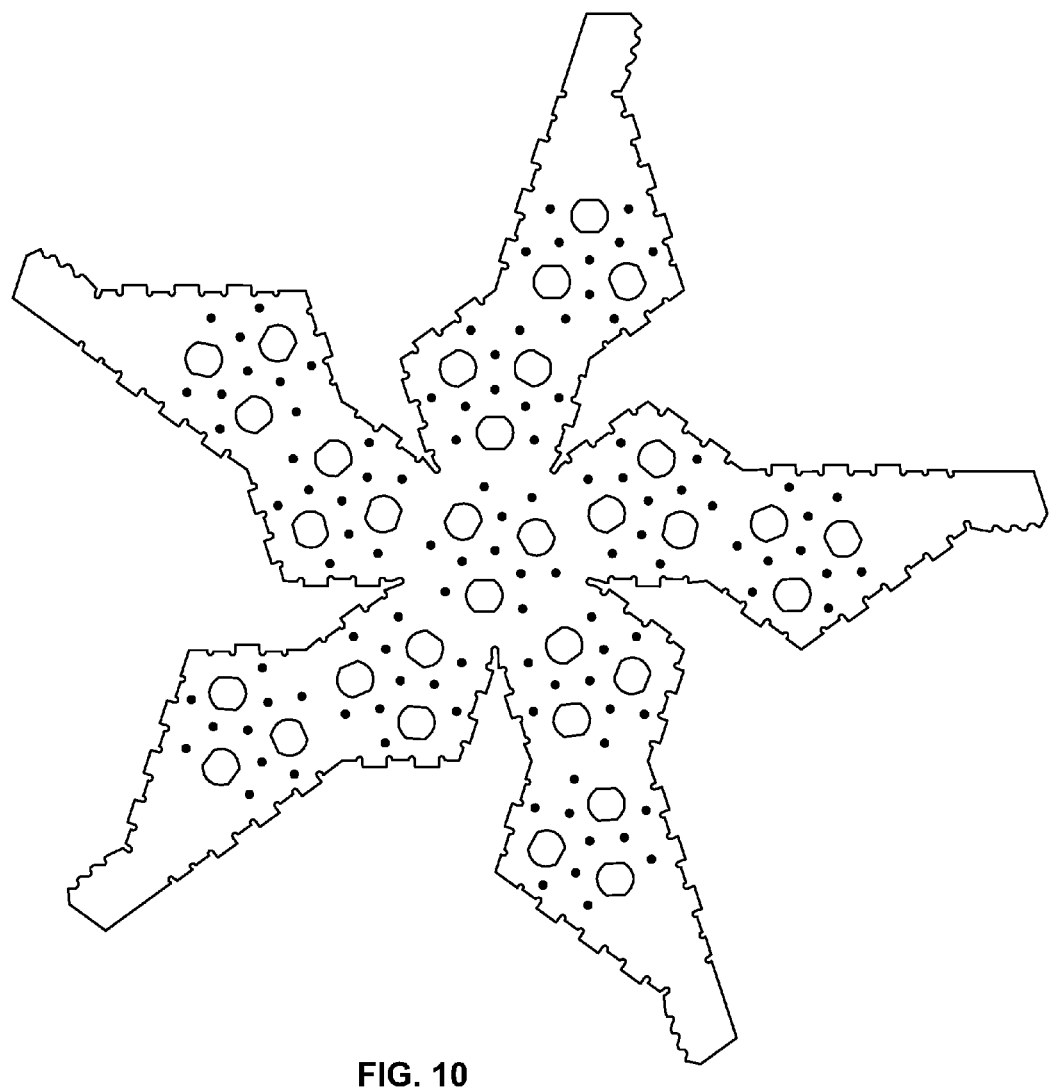
FIG. 10 is a schematic view of a two-dimensional PCB in a star configuration, according to another embodiment of the present invention.

The electronic components are then placed on the inner non-conductive layer using an SMT process. FIG. 10 illustrates one embodiment of a 2-D structure with electronic components mounted.

In one embodiment, according to the pre-designed shape, the PCB is milled to form the corresponding plurality of faces of a polyhedron, for example, a dodecahedron polyhedron of the present invention will have eleven faces and one open end, for a total of twelve sides. PCB milling machines known in the art can be used. In addition to the general form of the 2-D PCB, edge teeth 160 are milled into the perimeter so that one side of a shape, such as the edge teeth on the right side of shape S1 will lock with the edge teeth on the left side of S3 when the shapes are bent along their bending lines. In this manner, a first set of edge teeth is configured to lock to and engage with a second set of edge teeth.

The milling bit used to form the edge teeth can optionally form circular corners in each of the teeth to facilitate milling. The circular corners and edge teeth in FIG. 2 were formed with a milling bit of 1.5 mm in diameter. One advantage of the circular corners is that it allows additional ventilation of internal heat to the external environment. Other size milling bits and other types of edge teeth are contemplated. In addition, other ways to interlock adjacent sides of the PCB are also contemplated including adhesive.

The size of each LED hole 110' depends on the dimensions of the chosen LEDs 110. The illustrated embodiment has three LED holes 110' in each of the five-sided shapes S1, S3, S5, S7 and S9 and six-sided shapes S2, S4, S6, S8 and S10 and one LED hole 110' in three of the remaining shapes, namely in S12, S14 and S15. Other configurations of LED holes 110' per shape are contemplated.

In other embodiments, rather than milling, a complex shape can be stamped to instantly cut it and the LED holes out a PCB blank. This requires an expensive mold to be first made and the process would therefore become economical after several thousand pieces have been stamped. Stamping is known to reduce manufacturing time and results in a decrease in the cost per piece.

At least two and up to four exposed metal pads are placed on the interior side of the PCB adjacent each of the LED holes 110'. The exposed pads are metal and are coupled to the inner conductive layer to provide electronic and thermal connectivity. The two required exposed pads, which are opposite each other are for coupling the LEDs 110 electrically to the PCB structure 101. These pads are not shown in FIG. 2 but are located under LED bracket 130. The other two exposed pads, which are opposite each other on either side of a LED hole 110' are for thermally coupling a heat sink to the PCB, the heat sink further coupled to each LED 110 as explained below. The two exposed pads for thermal coupling each LED are not shown in FIG. 2 but are located under heat sink at each location 120.

Optionally, as illustrated in FIG. 2, ventilation spaces 150 are drilled into each of the fifteen shapes S1-S15 of the 2-D PCB 100. The ventilation spaces 150 are sized to meet current certification standards of being small enough to prevent the insertion of an object such as a probe 2 mm or more in diameter. In this example the ventilation spaces 150 are about 1.8 mm in diameter or less. The illustrated embodiment has ten ventilation spaces 150 in each of the five-sided shapes S1, S3, S5, S7 and S9 and six-sided shapes S2, S4, S6, S8 and S10, each ventilation space 150 being proximate to an LED hole 110'. There are either one, two or three further ventilation spaces 150 in the remaining shapes, namely shapes S11-S15 such that when shapes S11-S15 are folded and assembled, they will combine to form the eleventh pentagonal shape having three LED holes 110' and ten ventilation spaces 150. Other configurations of ventilation spaces per shape are contemplated. As well, other dimensions and number of ventilations spaces are contemplated, so long as they satisfy certification and safety standards. The ventilation spaces 150 facilitate the heat exchange from inside the folded PCB to the external environment by venting the relatively hotter air out of the closed structure. The optional addition of further ventilation spaces 150 may further lengthen the lifetime of individual LEDs and the LED light of the present invention.

LEDs are chosen to satisfy the efficiency requirements of the LED light. In one embodiment, each LED is an XLamp™ XP-G2 from Cree, Inc. (Durham, N.C., USA), rated at 350 mA. Alternatively, each LED is a V Series from Bridgelux (Livermore, Calif., USA), also rated at 350 mA. LEDs from multiple suppliers were tested.

The tested LEDs of the present invention have a rated life of at least 30,000 hours, and can operate in temperatures of up to about 100 degrees C. Each LED is coated with a suitable phosphor mixture using known techniques to convert the emitted monochromatic blue light to broad spectrum white light having an acceptable CRI of at least 70 and higher and a CCT of at least 2700 and higher, known as soft or warm light, similar to incandescent light.

The laser cutting of the illustrated embodiment is straight. Precise operation of the laser cutter includes specific control of the laser beam power, speed, number of passes, and focus lens. The depth of each cut depends on the number of outer layers in the PCB and their depth. The cut line must be deep enough to permit controlled bending of adjacent sides of the cut line and at least part of the outer non-conductive layer. If the cut passes though the entire outer layer and reaches the internal conductive layer, the subsequently folded part will not have sufficient strength to maintain the fold and will tend to break. As such, as least part of the outer layer must remain uncut. Bending lines are therefore cut part way through but not all the way through the outer non-conductive layer of the PCB. Since the bending line is cut on the outer non-conductive layer, the driver circuit, which is on the other side of the PCB, is not affected.

Multiple LEDs 110 are mounted to the LED holes 110' on the PCB structure 101. In some embodiments, three LED's are mounted on each face. Other embodiments comprise one to five LED's per face. The number of LEDs on the LED light depends on the requirements of the embodiment.

Figure 8A:
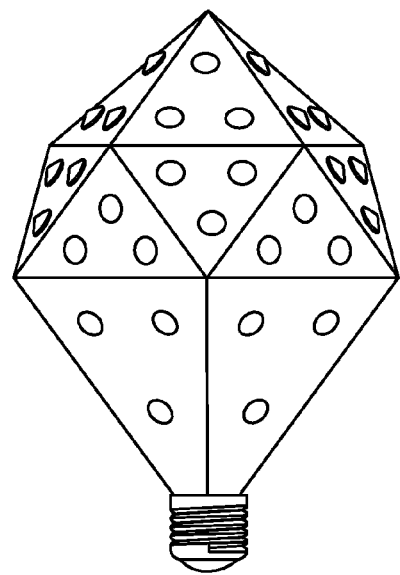
FIG. 8A is a schematic perspective view of another embodiment of the present invention comprising a 20-sided PCB and fitting with three LEDs per side.
Figure 8B:
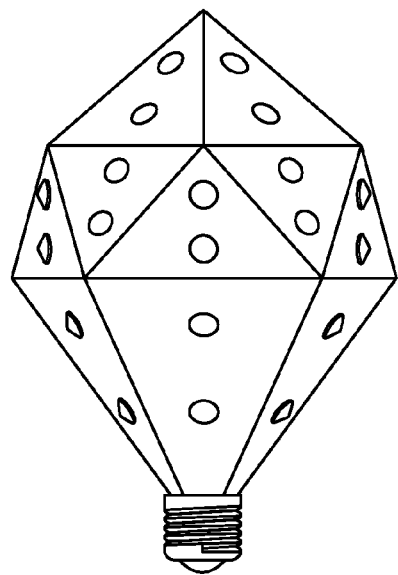
FIG. 8B is a schematic perspective view of another embodiment of the present invention comprising a 20-sided PCB and fitting with two LEDs per side.
Figure 8C:
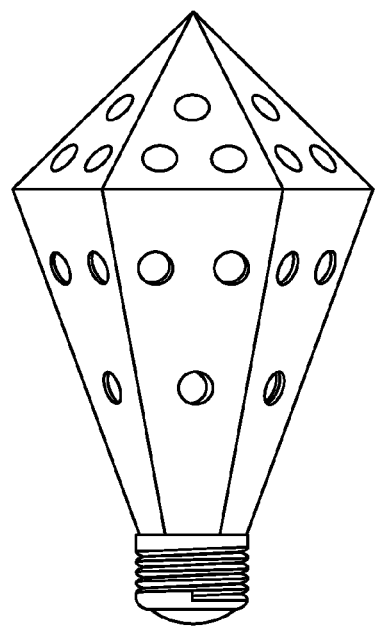
FIG. 8C is a schematic perspective view of another embodiment of the present invention comprising a 12-sided PCB and fitting with three LEDs per side.
Figure 8D:
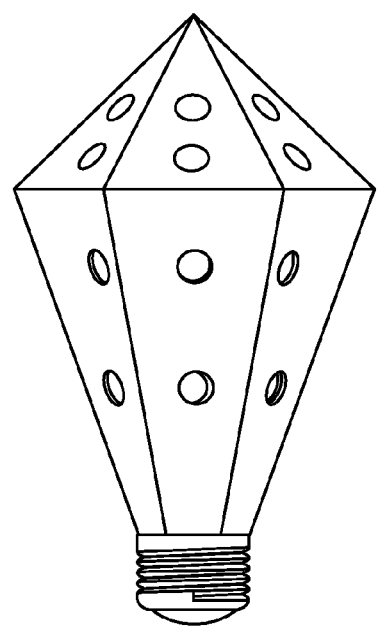
FIG. 8D is a schematic perspective view of another embodiment of the present invention comprising a 12-sided PCB and fitting with two LEDs per side.
Figure 8E:
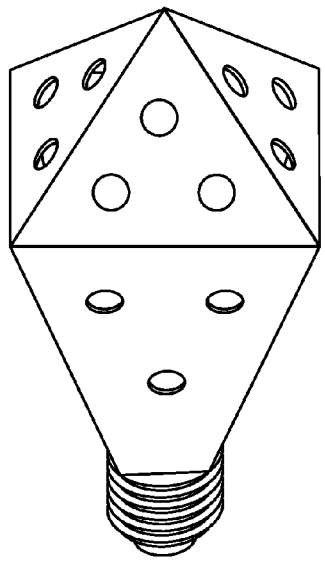
FIG. 8E is a schematic perspective view of another embodiment of the present invention comprising an 8-sided PCB and fitting with three LEDs per side.
Figure 8F:
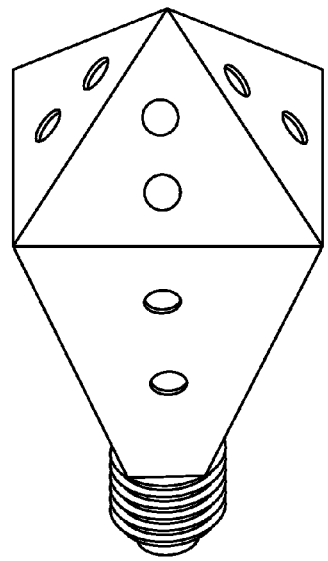
FIG. 8F is a schematic perspective view of another embodiment of the present invention comprising an 8-sided PCB and fitting with two LEDs per side.
Figure 8G:
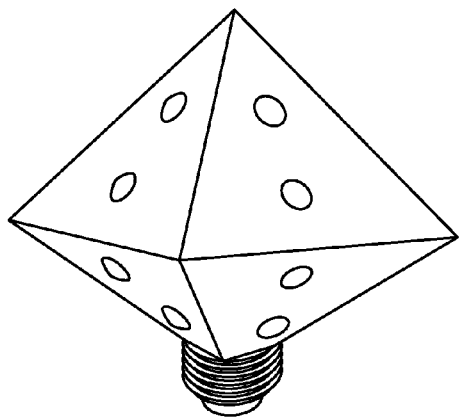
FIG. 8G is a schematic perspective view of another embodiment of the present invention comprising a 6-sided PCB and fitting with two LEDs per side.
Figure 8H:
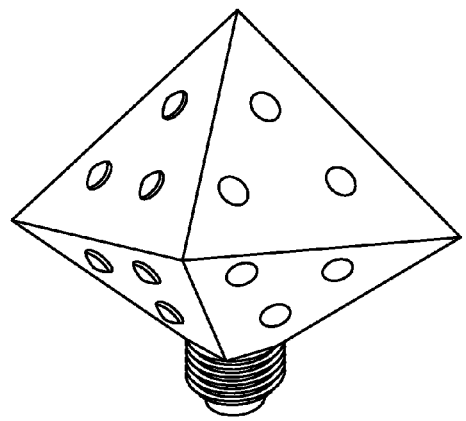
FIG. 8H is a schematic perspective view of another embodiment of the present invention comprising a 6-sided PCB and fitting with three LEDs per side.
Figure 8I:
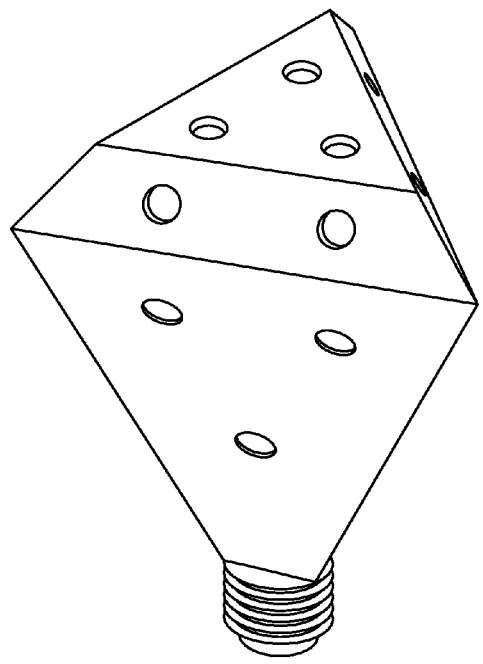
FIG. 8I is a schematic perspective view of another embodiment of the present invention comprising a 7-sided PCB and fitting with two or three LEDs per side.
Figure 8J:
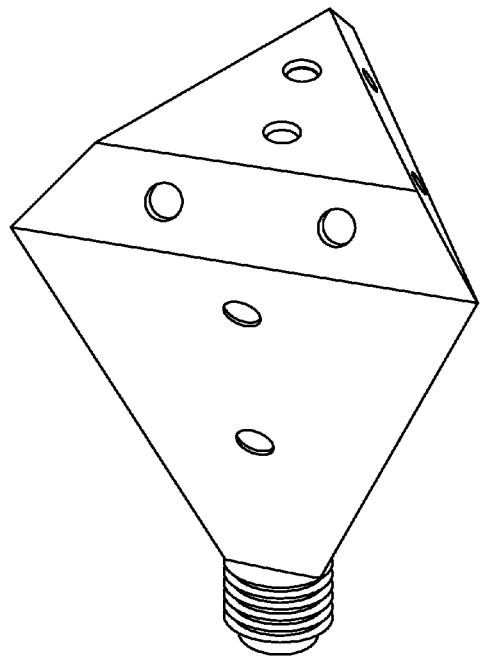
FIG. 8J is a schematic perspective view of another embodiment of the present invention comprising a 7-sided PCB and fitting with two LEDs per side.
Figure 8K:
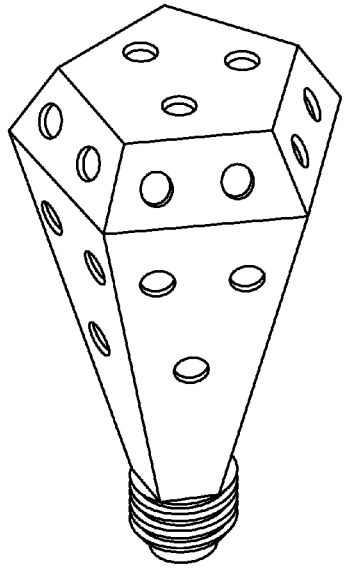
FIG. 8K is a schematic perspective view of another embodiment of the present invention comprising an 11-sided PCB and fitting with two or three LEDs per side.
Figure 8L:
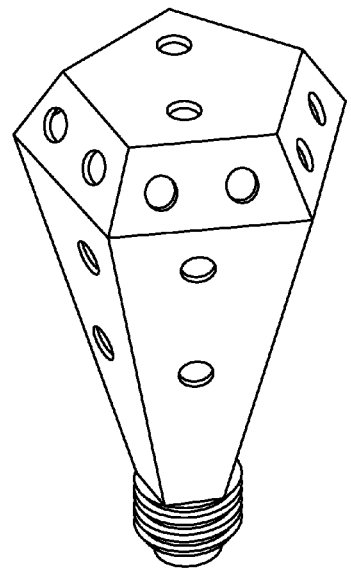
FIG. 8L is a schematic perspective view of another embodiment of the present invention comprising an 11-sided PCB and fitting with two LEDs per side.
Figure 8Q:
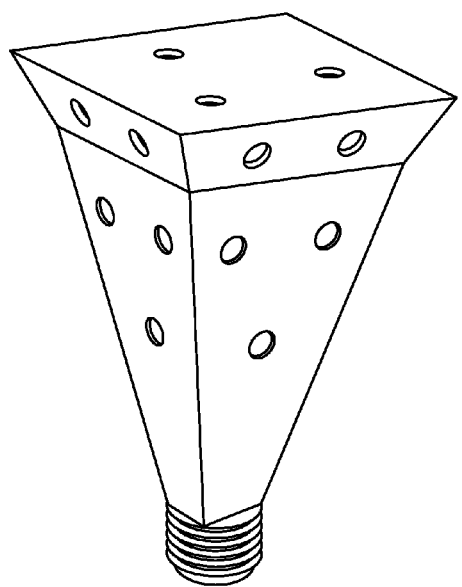
FIG. 8Q is a schematic perspective view of another embodiment of the present invention comprising a 9-sided PCB and fitting with two or three LEDs per side.
Figure 8R:
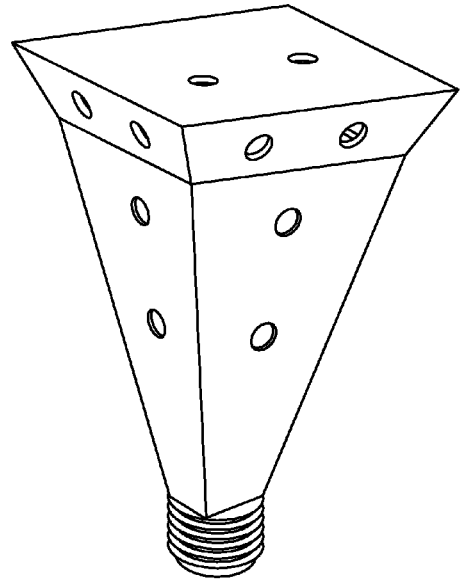
FIG. 8R is a schematic perspective view of another embodiment of the present invention comprising a 9-sided PCB and fitting with two LEDs per side.
Figure 8S:
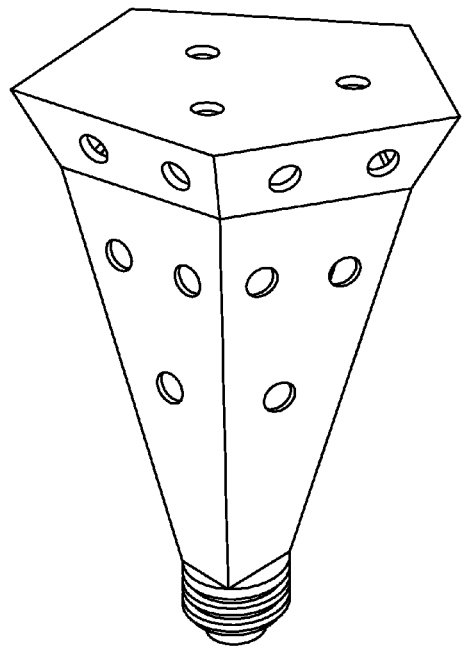
FIG. 8S is a schematic perspective view of another embodiment of the present invention comprising an 11-sided PCB and fitting with two or three LEDs per side.
Figure 8T:
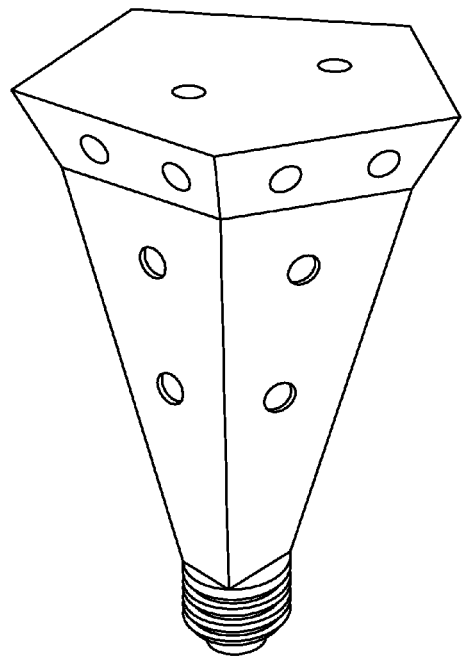
FIG. 8T is a schematic perspective view of another embodiment of the present invention comprising an 11-sided PCB and fitting with two LEDs per side.
Figure 8U:
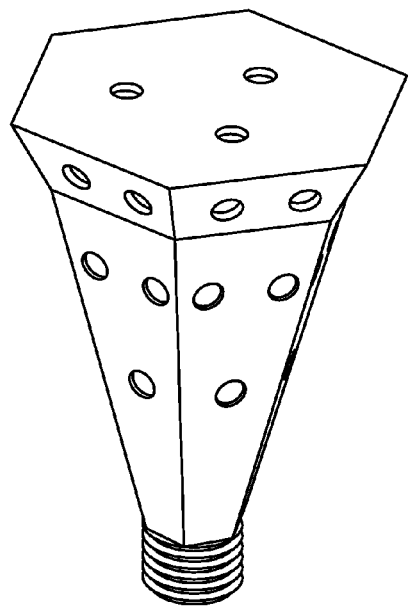
FIG. 8U is a schematic perspective view of another embodiment of the present invention comprising a 13-sided PCB and fitting with two or three LEDs per side.
Figure 8V:
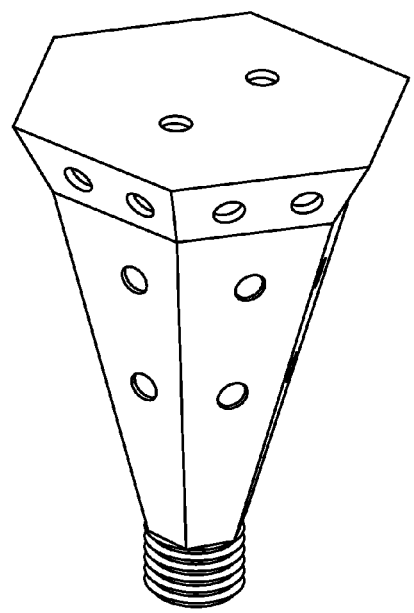
FIG. 8V is a schematic perspective view of another embodiment of the present invention comprising a 13-sided PCB and fitting with two LEDs per side.
Figure 8W:
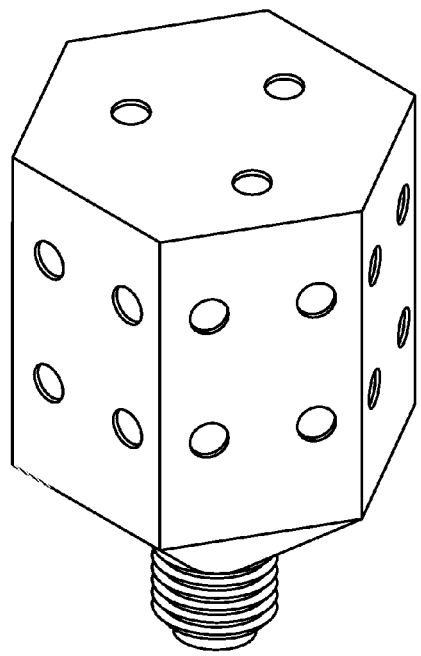
FIG. 8W is a schematic perspective view of another embodiment of the present invention comprising a 13-sided PCB and fitting with three or four LEDs on each of seven sides.
Figure 8X:
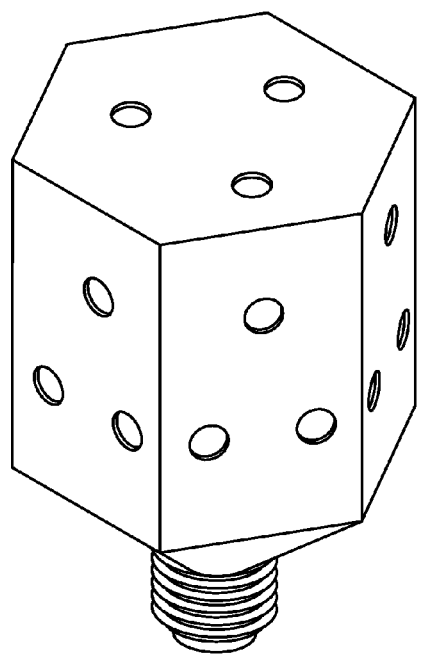
FIG. 8X is a schematic perspective view of another embodiment of the present invention comprising a 13-sided PCB and fitting with three LEDs on each of seven sides.
Figure 8Y:
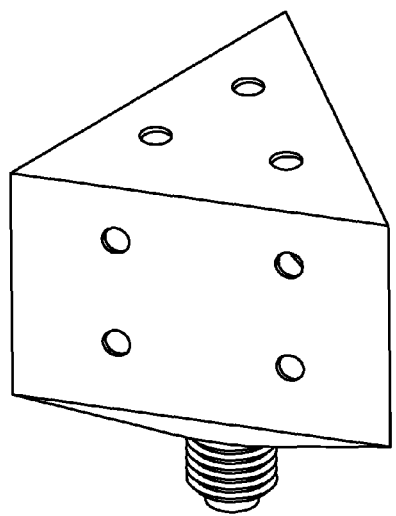
FIG. 8Y is a schematic perspective view of another embodiment of the present invention comprising a 7-sided PCB and fitting with three or four LEDs on each of four sides.
Figure 8Z:
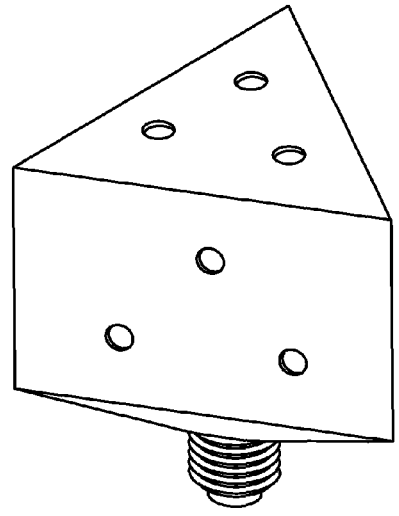
FIG. 8Z is a schematic perspective view of another embodiment of the present invention comprising a 7-sided PCB and fitting with three LEDs on each of four sides.
Figure 8A:
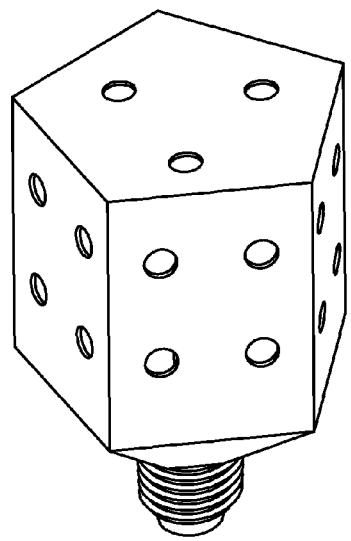
Figure 8B:
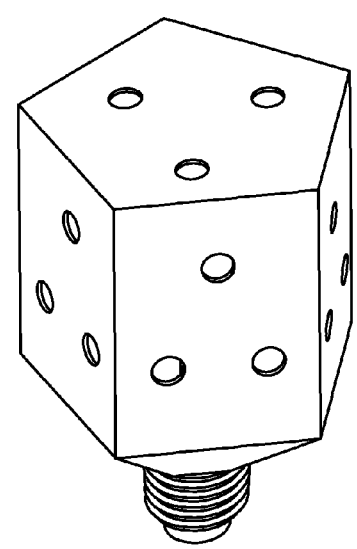
Figure 8C:
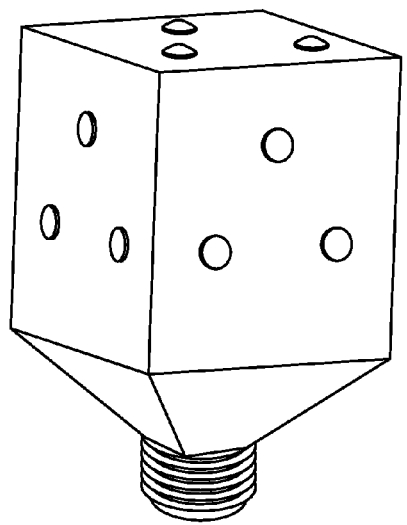
Figure 8D:
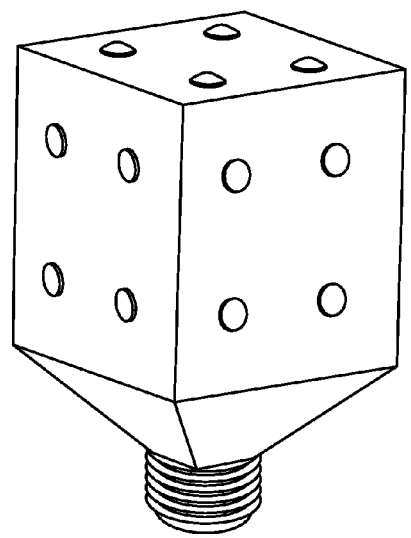
Figure 8E:
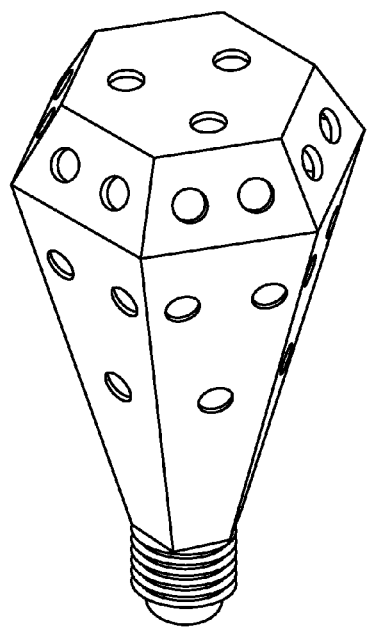
Figure 8F:
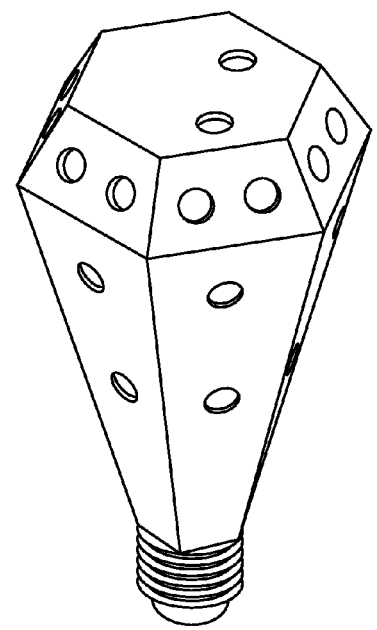
Figure 8G:
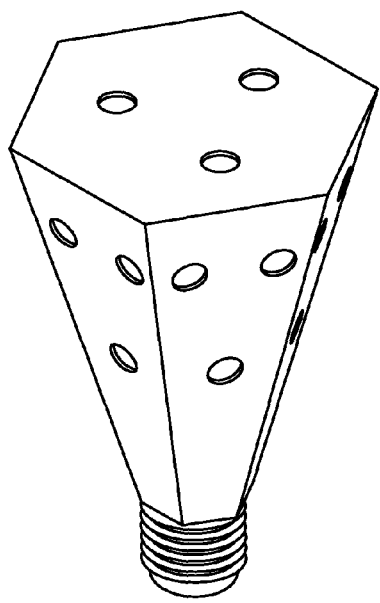
Figure 8H:
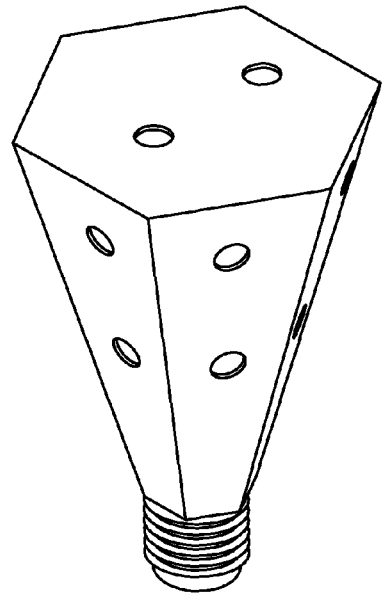
Figure 8I:
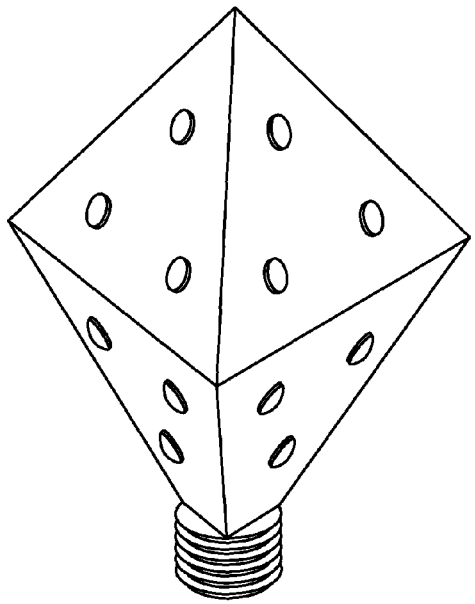
Figure 8J:
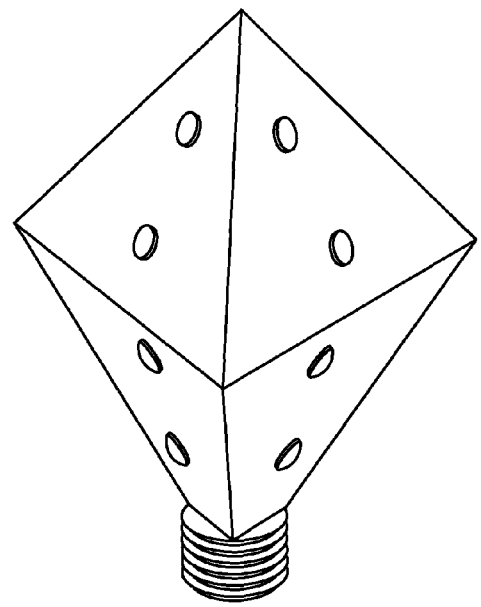
Figure 8K:
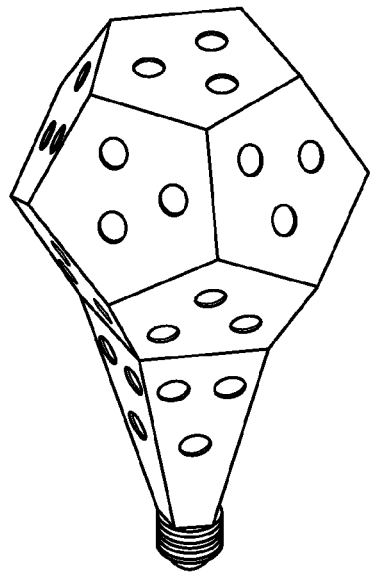
Figure 8L:
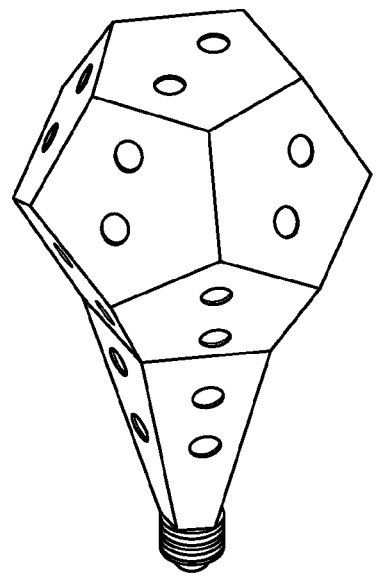
Figure 8M:
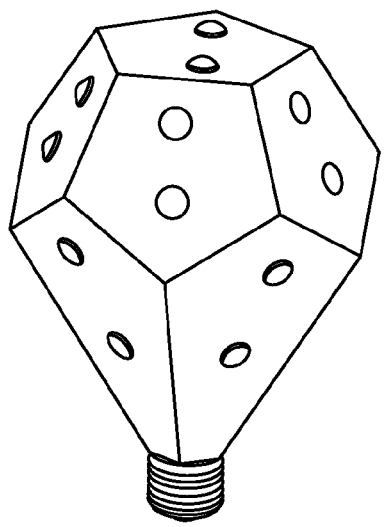
FIG. 8M is a schematic perspective view of another embodiment of the present invention comprising a 9-sided PCB and fitting with two or three LEDs per side.
Figure 8N:
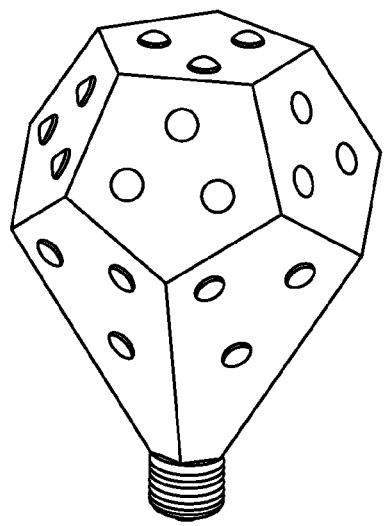
FIG. 8N is a schematic perspective view of another embodiment of the present invention comprising a 9-sided PCB and fitting with two LEDs per side.
Figure 8O:
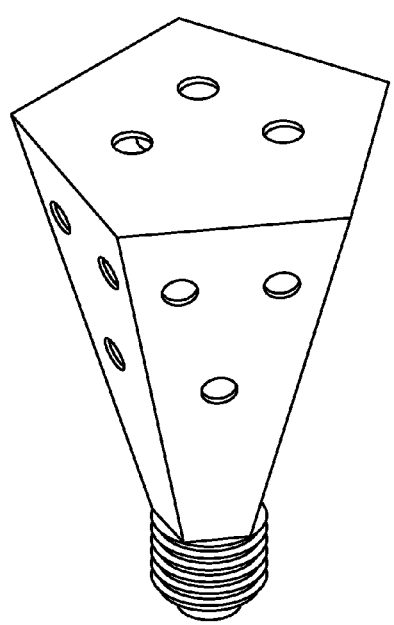
FIG. 8O is a schematic perspective view of another embodiment of the present invention comprising a 7-sided PCB and fitting with three LEDs per side.
Figure 8P:
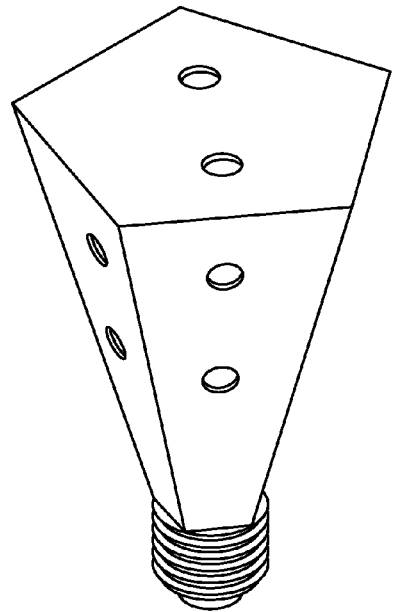
FIG. 8P is a schematic perspective view of another embodiment of the present invention comprising a 7-sided PCB and fitting with two LEDs per side.
Figure 8Q:
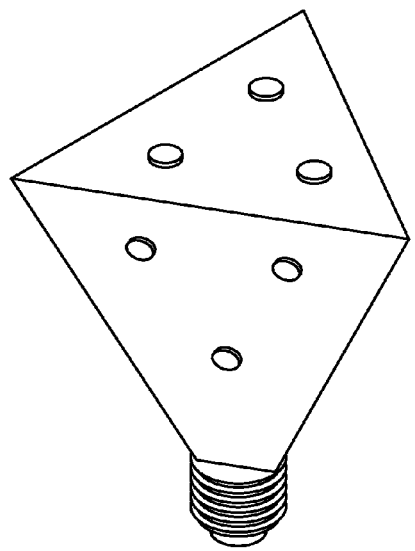
Figure 8R:
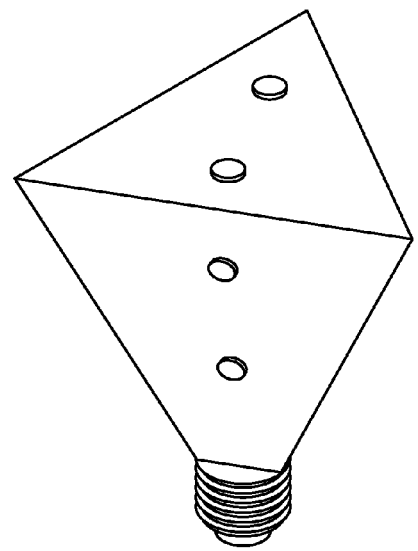

Various shapes of LED lights according to the present invention are shown in FIG. 8A to FIG. 8TT as follows:

FIG. 8A: 20-sided PCB and fitting with three LEDs per side;

FIG. 8B: 20-sided PCB and fitting with two LEDs per side;

FIG. 8C: 12-sided PCB and fitting with three LEDs per side;

FIG. 8D: 12-sided PCB and fitting with two LEDs per side;

FIG. 8E: 8-sided PCB and fitting with three LEDs per side;

FIG. 8F: 8-sided PCB and fitting with two LEDs per side;

FIG. 8G: 6-sided PCB and fitting with two LEDs per side;

FIG. 8H: 6-sided PCB and fitting with three LEDs per side;

FIG. 8I: 7-sided PCB and fitting with two or three LEDs per side;

FIG. 8J: 7-sided PCB and fitting with two LEDs per side;

FIG. 8K: 11-sided PCB and fitting with two or three LEDs per side;

FIG. 8L: 11-sided PCB and fitting with two LEDs per side;

FIG. 8M: 9-sided PCB and fitting with two or three LEDs per side;

FIG. 8N: 9-sided PCB and fitting with two LEDs per side;

FIG. 8O: 7-sided PCB and fitting with three LEDs per side;

FIG. 8P: 7-sided PCB and fitting with two LEDs per side;

FIG. 8Q: 9-sided PCB and fitting with two or three LEDs per side;

FIG. 8R: 9-sided PCB and fitting with two LEDs per side;

FIG. 8S: 11-sided PCB and fitting with two or three LEDs per side;

FIG. 8T: 11-sided PCB and fitting with two LEDs per side;

FIG. 8U: 13-sided PCB and fitting with two or three LEDs per side;

FIG. 8V: 13-sided PCB and fitting with two LEDs per side;

FIG. 8W: 13-sided PCB and fitting with three or four LEDs on each of seven sides;

FIG. 8X: 13-sided PCB and fitting with three LEDs on each of seven sides;

FIG. 8Y: 7-sided PCB and fitting with three or four LEDs on each of four sides;

FIG. 8Z: 7-sided PCB and fitting with three LEDs on each of four sides;

FIG. 8AA: 11-sided PCB and fitting with three or four LEDs on each of six sides;

FIG. 8BB: 11-sided PCB and fitting with three LEDs on each of six sides;

FIG. 8CC: 9-sided PCB and fitting with three LEDs on each of five sides;

FIG. 8DD: 9-sided PCB and fitting with four LEDs on each of five sides;

FIG. 8EE: 13-sided PCB and fitting with two or three LEDs per side;

FIG. 8FF: 13-sided PCB and fitting with two LEDs per side;

FIG. 8GG: 7-sided PCB and fitting with three LEDs per side;

FIG. 8HH: 7-sided PCB and fitting with two LEDs per side;

FIG. 8II: 8-sided PCB and fitting with three LEDs per side;

FIG. 8JJ: 8-sided PCB and fitting with two LEDs per side;

FIG. 8KK: 16-sided PCB and fitting with three LEDs per side;

FIG. 8LL: 16-sided PCB and fitting with two LEDs per side;

FIG. 8MM: 11-sided PCB and fitting with two LEDs per side;

FIG. 8NN: 11-sided PCB and fitting with three LEDs per side;

FIG. 8OO: 6-sided PCB and fitting with three LEDs per side;

FIG. 8PP: 6-sided PCB and fitting with two LEDs per side;

FIG. 8QQ: 4-sided PCB and fitting with three LEDs per side;

FIG. 8RR: 4-sided PCB and fitting with two LEDs per side;

FIG. 8SS: 5-sided PCB and fitting with three LEDs per side; and

FIG. 8TT: 5-sided PCB and fitting with two LEDs per side.

The 3-D structures contemplated in the present invention have multiple LEDs which yield light in multiple directions, thereby providing omnidirectional light. Certain 3-D shapes of LED lights have multiples sides, with one or more LEDs per side, are contemplated. In some embodiments, one or more sides does not have a LED light. As illustrated, a variety of polyhedron shapes is contemplated, wherein each shape comprises at least four faces and an open end. In some embodiments, the polyhedron has up to twenty faces and an open end. In other embodiments, the polyhedron has eleven faces and an open end, as shown in FIGS. 4-7 and 8W (where the open end is attached to a light fitting). Some polyhedron shapes of the present invention are Platonic solids, whereas others are irregular polyhedrons.

The 3-D structure of the present invention has a plurality of faces where one or more faces is shaped as a polygon chosen from the group consisting of a triangle, a quadrilateral, a pentagon and a hexagon. In some embodiments, some faces are triangular, while others are not. In other embodiments, one face of the three-dimensional shape comprises several parts of the PCB folded to complement each other without overlap and together form the one assembled outer face. In this manner, from the user's perspective, all faces of the LED light bulb appear to be identical.

Each of the plurality of faces of the folded 3-D structure of the present invention comprises an outer face and a corresponding inner face. The outer face is visible to the user and exposes the LED and any design or other marking, if applicable, etched on the outer surface of the PCB.

The inner surface is not visible to users, in normal operating conditions. The electronic components are coupled to the inner surface. The PCB comprises at least one outer non-conductive layer, also known as the outer face, and at least one internal conductive layer. The internal conductive layer is sandwiched between the outer non-conductive layer and at least one internal non-conductive layer. The most internal non-conductive layer is also known as the inner face.

It is further contemplated to omit placing any LEDs on one or more surfaces such as for ceiling lighting. For example, the 3-D structures illustrated in FIGS. 8O and 8P comprise faces proximate the light fitting which do not comprise any LEDs. This type of structure may be placed in a ceiling or wall application where illumination is not required in the direction of the surface.

To calculate optimal efficiency of the LED light, trials were conducted on the PCB structure of FIG. 2 having eleven faces and one open end. Three trials each were conducted using one, two, three, four and five LEDs per face. All LEDs were from the same manufacturer and were rated for 350 mA current with a lifetime of 30,000 hours. To achieve the same lumen output of about 1,600 lumens, the current through the LEDs was underdriven for trials having 1, 2, 3, 4 and 5 LEDs per face, corresponding to 350 mA, 175 mA, 117 mA, 87.5 mA and 70 mA, respectively. The forward voltage was measured across each LED. The lumen output was measured by an integrating sphere.

In estimating the cost of electricity at USD$0.14/kWh, and a constant cost of each LED, over the rated lifetime of the LED light, it was determined that a light having 3 LEDs per face or 33 LEDs in total was the most economical option in one embodiment, when cost of the LEDs and energy used over the light's lifetime was considered. In order of measured efficiency, it was determined that next, 2 LEDs per face, 4 LEDs per face, 5 LEDs per face and finally 1 LED per face were lesser economical. As such, in one embodiment, the LED light has 3 LEDs 110 per face for a total of 33 LEDs 110.

Figures 3A, 3B:
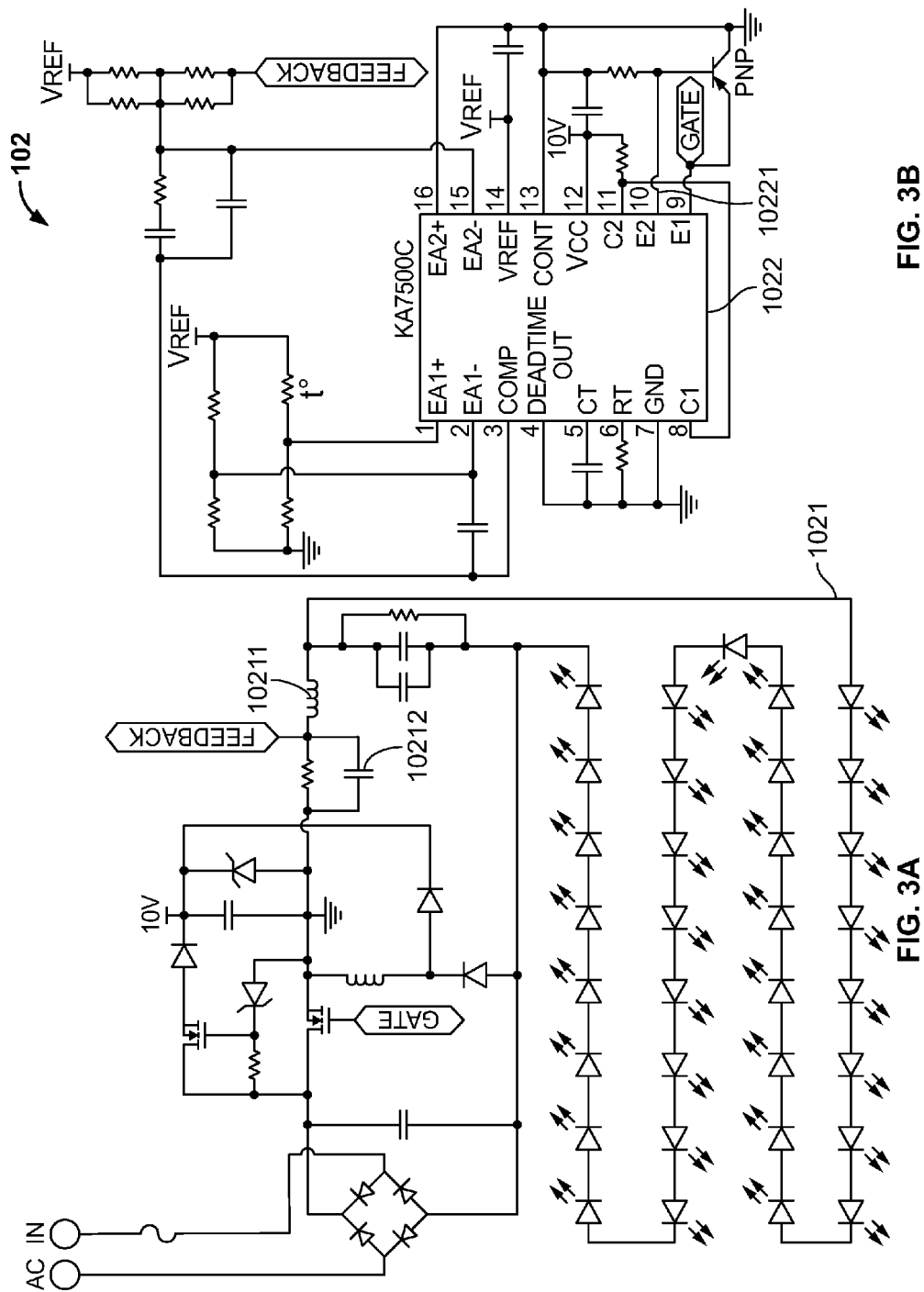
FIG. 3A is a schematic view of a first circuit of the driver circuit, according to one embodiment of the present invention.
FIG. 3B is a schematic view of a second circuit of the driver circuit, according to one embodiment of the present invention.
Figure 5A:
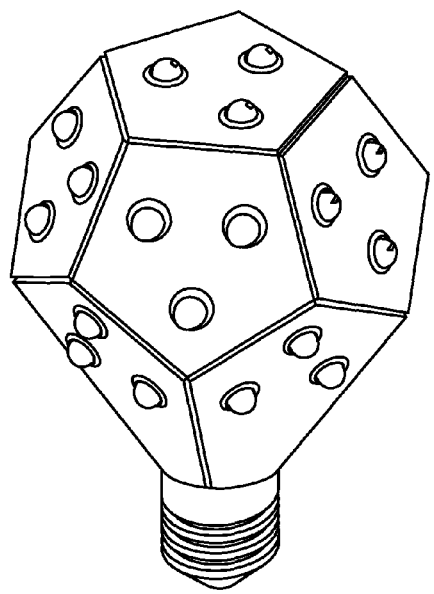
FIGS. 5A-D are schematic perspective, bottom, side and top views of the 3-D shaped LED bulb, respectively, comprising three protruding LEDs per face and an Edison screw fitting, according to another embodiment of the present invention.
Figure 5B:
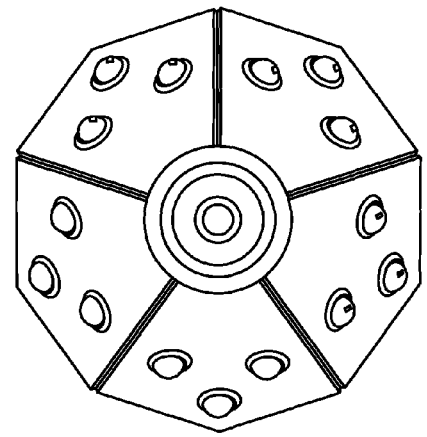
Figure 5C:
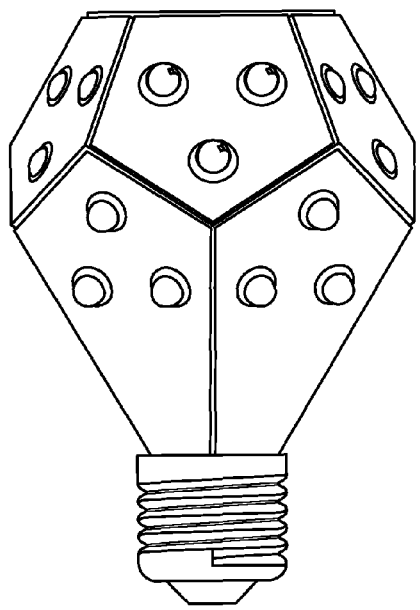
Figure 5D:
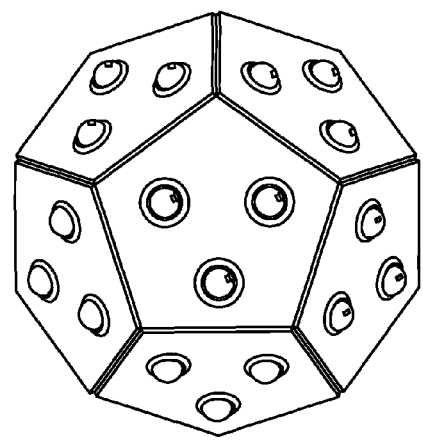
Figure 6A:
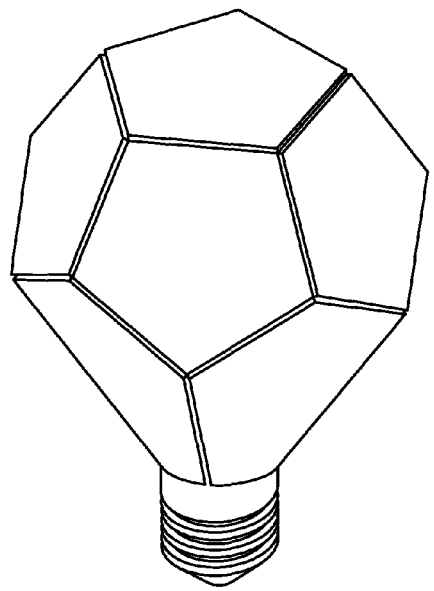
FIGS. 6A-D are schematic perspective, bottom, side and top views of the 3-D shaped LED bulb, respectively, comprising an Edison screw fitting, according to another embodiment of the present invention.
Figure 6B:
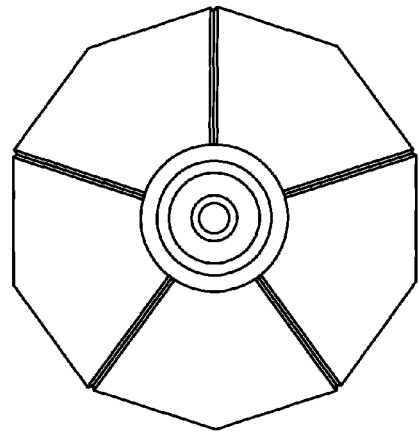
Figure 6C:
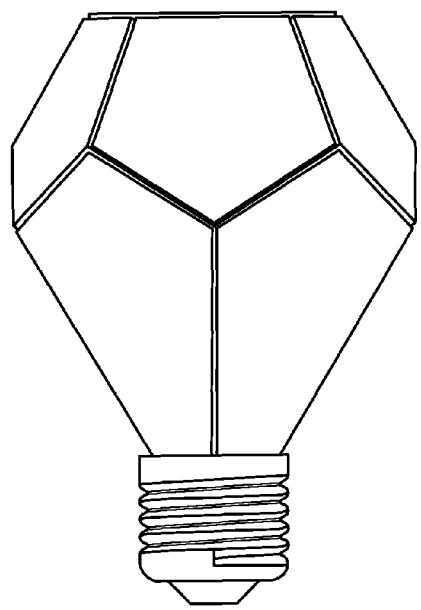
Figure 6D:
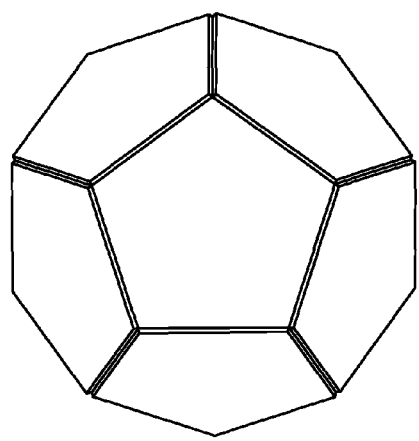
Figure 7A:
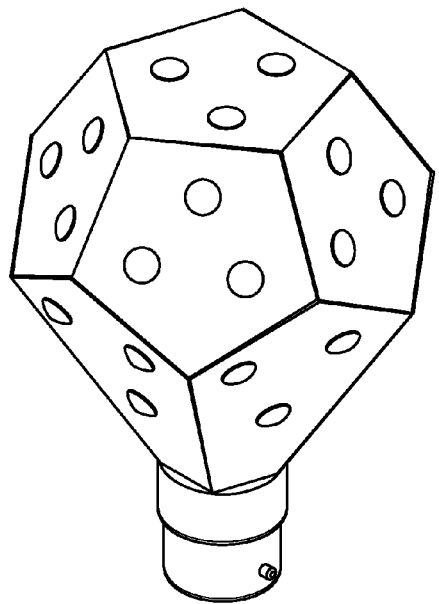
FIGS. 7A-D are schematic perspective, bottom, side and top views of the 3-D shaped LED bulb, respectively, comprising three LEDs per face and a bayonet mount fitting, according to another embodiment of the present invention.
Figure 7B:
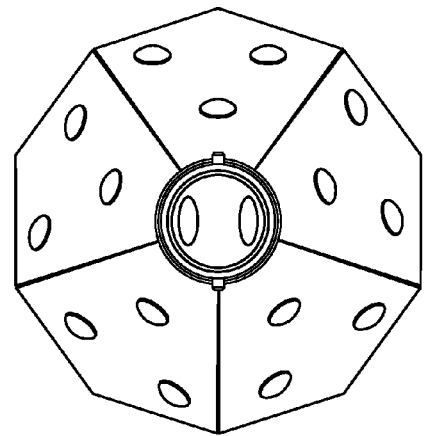
Figure 7C:
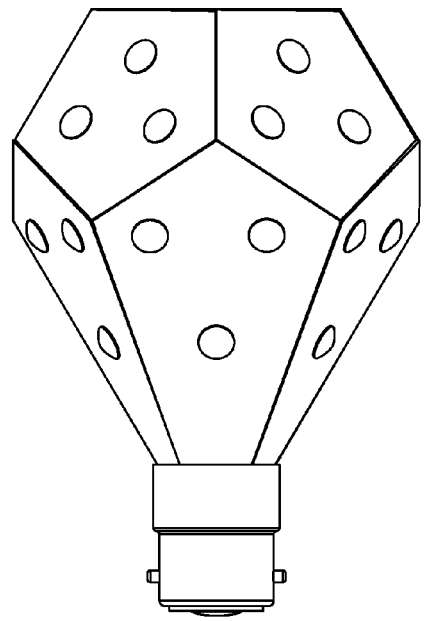
Figure 7D:
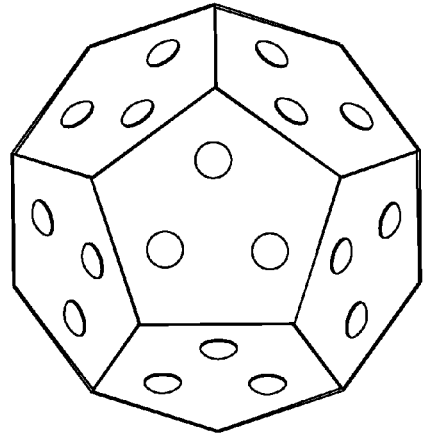

A driver circuit 102 as illustrated in FIGS. 3A and 3B was designed and disposed on the PCB 101 to drive the LEDs 110. The driver circuit 102 includes a first circuit 1021 which, for example, comprises conventional inductor 10211 and capacitor 10212 and a second circuit which, for example, comprises a pulse-width modulation integrated circuit (IC) 1022 and surrounding components that set up its operational parameters such as switching frequency and current regulation set point. The IC 1022 comprises several pins 10221. The driver circuit 102 is a standard buck converter with regenerative snubber to allow voltage from the mains to be converted to a lower voltage for use by the LEDs 110.

Reverse recovery charge on the main switching diode is captured and used as an auxiliary power supply for the controller IC 1022. Current is measured using a shunt resistor and sent to the controller IC which provides a closed feedback loop to precisely regulate LED current and hence provide flicker-free brightness.

In one embodiment, a temperature sensor is configured to detect a temperature condition within the three-dimensional shape, such as a danger threshold of 90 degrees Celcius when the LED light is energized at ambient conditions. When the threshold is met, the sensor causes the circuit to lower the current in the LED light to prevent circuit failure, which prolongs the life of the LED bulb. The sensor can further be configured to detect the threshold temperature over a period of time, such as about 10 seconds, determined by a low pass filter. Other lower or higher temperature conditions and detection times are contemplated. Once the specified condition is reached, the circuit incrementally reduces the current by almost six times, such as from 117 mA to as low as about 20 mA.

In some embodiments, at normal operating conditions the temperature of each of the plurality of LEDs does not exceed about 70 degrees Celcius when the LED light is energized at ambient conditions.

In another embodiment, when the condition is reached, the circuit automatically stops the current by lowering the duty ratio of the pulse width modulation signal to zero.

Figure 11:
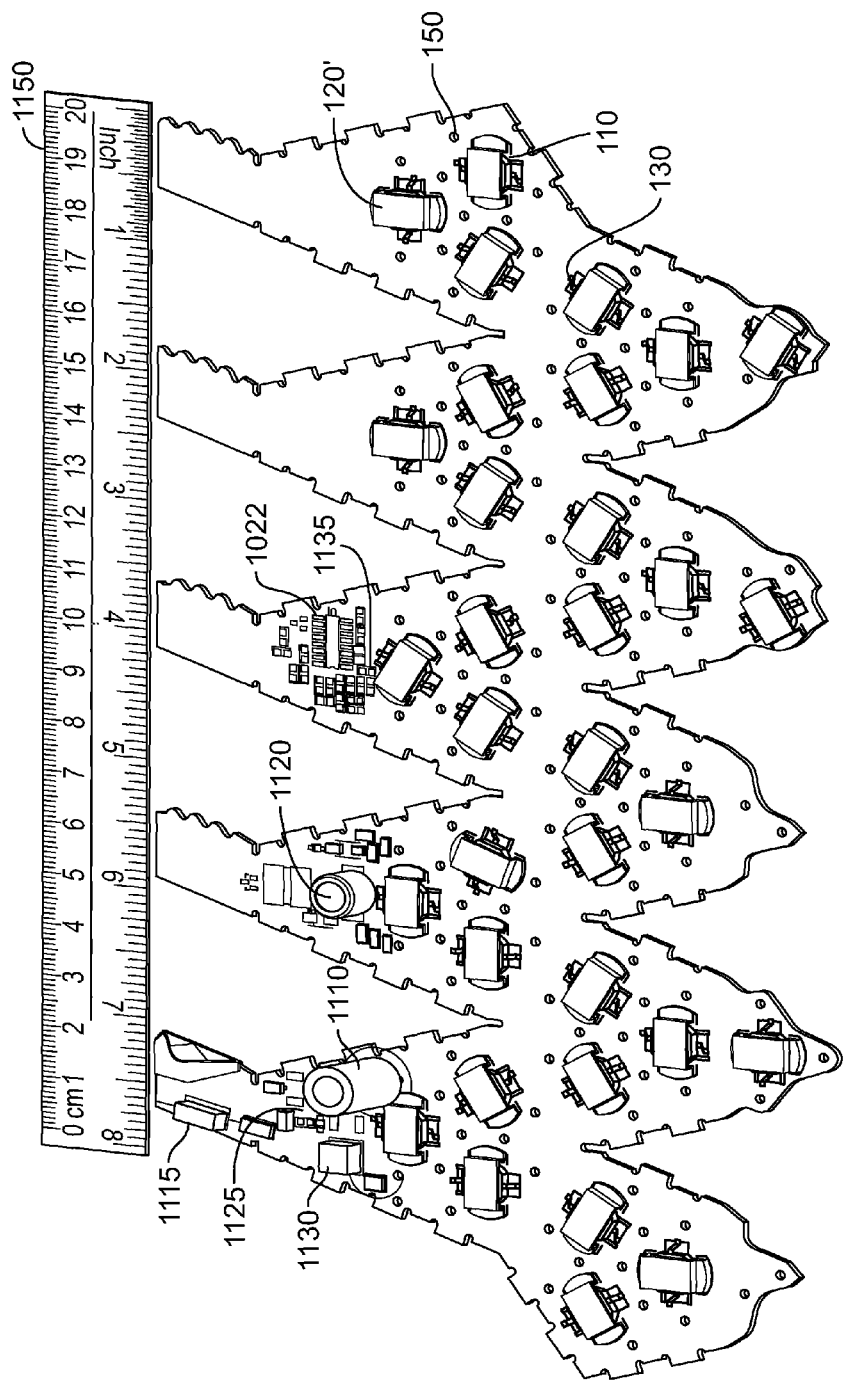
FIG. 11 is a labelled interior view of the assembled two-dimensional PCB and components adjacent a ruler, according to one embodiment of the present invention.

As shown in FIG. 11, other electronic components include a bulk storage capacitor 1110, a fuse 1115, a main inductor 1120 and a main switching MOSFET 1125 located behind bulk capacitor 1110. A startup voltage regulator MOSFET 1130 is included that provides the temporary initial energy to the controller IC 1022 so that operation can begin. The circuit also implements over-temperature protection with a temperature sensor 1135 to prevent the light bulb from destroying itself when sufficient cooling is not available, such as inside a sealed enclosure. A ruler 1150 is positioned adjacent the assembled PCB to provide one example of the scale. The skilled worker will appreciate that the dimensions of the light bulb of the present invention may be changed to accommodate different situations, depending on the availability of components and cost considerations.

Other circuit configurations to drive the LEDs 110 of the present invention were tested. Power losses were measured at the inductor resistance, the inductor core, MOSFET conduction, MOSFET switching, the IC power supply, the shunt resistor, the freewheeling diode, the rectifier, the capacitors and the wires/traces. With the choice of appropriate components, the circuit 102 was optimized to about 95.0% efficiency.

After the circuit components are assembled, the PCB 101 is cured in a reflow oven. After cooling, each LED 110 is placed through LED hole 110' and connected at the bracket 130 to two exposed pads located on either side of the LED hole 110'. The exposed pads are coupled to the internal conductive layer and provide an electronic connection from each LED 110 to the driver circuit 102. The connection is by standard solder, usually lead free and ROHS compliant.

The LEDs may be connected serially or in parallel. Thus, when a power source is applied to the LED light, all the LEDs 110 illuminate accordingly.

Heat Dissipation System

The main heat dissipation system is the PCB structure 101 itself. Heat from each LED is dissipated both outward to the external environment and inward to within the closed shape. Heat from the internal components is also absorbed by the PCB structure 101, then dissipated outward to the external environment.

In one embodiment of the invention, there are two additional exposed pads located proximate each LED. A small heat sink 120, 120' made from metal is mounted on the back of each LED 110 at the LED's heat pad. Preferably, the small heat sink 120, 120' is made of copper or aluminum due to their high thermal conductivity.

FIGS. 9A and 9B illustrate embodiments of a heat sink of the present invention. FIG. 9B shows both sides of the heat sink i, ii. As illustrated, the heat sink 120, 120' comprises two connecting portions 121, 121' and a contacting portion 122, 122'. The two connecting portions 121, 121' and the contacting portion 122, 122' are connected to each other by a bridge. The two connecting portions 121, 121' are coupled to the PCB with an adhesive, such as a heat conductive silicone. Alternatively, the heat sink is attached by solder. one embodiment, adhesive was determined to be quicker to connect the LEDs 110 to the conductive components. Heat can be conducted from the LED to the contacting portion 122, 122' and further to the surface of the PCB through the two connecting portions 121, 121'. FIG. 9A is a heat sink with a relatively wider contacting portion 121 while FIG. 9B is a heat sink with a relatively narrower contacting portion 121'. In other embodiments, the connecting portions 121, 121' of the heat sink 120, 121' can have other shapes such as fin-type structures (not illustrated) to further increase the contacting area and therefore improve heat dissipation.

The illustrated embodiment of FIG. 11 illustrates 33 heat sinks 120', each in contact with a respective LED 110.

After illuminating the LED bulb 100, heat is generated and is transferred to the PCB 101 as well as to the heat sink 120, 121' followed by transferring heat to the outer surface 180 of the PCB to further dissipate heat to the air. By doing so, the generated heat can be immediately and effectively removed, and the LED 110 hence remains at a suitable temperature while it is illuminated, namely about 60+/−5 degrees C. in ambient conditions. Since all the area of the LED bulb 100 except for the LEDs 110 itself may serve to dissipate heat, the heat-dissipating system of the LED bulb 100 of the present invention is advantageous.

Thus, an additional electric fan or bulky heat dissipation mechanism such as a fin system or other externally visible heat sink or other dissipation mechanism is not required in the present invention. This not only decreases manufacturing cost and weight, but it also effectively extends the lifetime of the LED bulb 100 of the present invention. Furthermore, a lack of externally visible heat sink allows designers the more freedom when configuring new template designs as described herein, without being hindered by traditional heat dissipation considerations.

As previously discussed, the optional ventilation holes 150 drilled in the PCB 101 promote air circulation from inside to outside of the folded LED bulb 100. The holes 150 help to dissipate heat generated by LEDs 110, and may further lengthen the lifetime of the LED bulb 100. To a lesser extent, the circular corners milled in the edge teeth may further assist with air circulation from within the PCB structure 101 and heat dissipation.

In one embodiment, about 8.6 W of heat is generated by the LED light and dissipated to the environment.

Assembly

In order to work with existing lamps and other light fixtures, the structural shell of the present invention comprises multiple edge teeth 170 to complementarily engage with the internal components of prior art light fittings. In particular, when designing the PCB, a plurality of edge teeth 170 on each face of the PCB may be formed. After folding the PCB, a circle-shaped thread connector which is shaped as several teeth may be formed. The formed connector, therefore, may be easily connected with a light fitting of the prior art, which allow for quick market adoption of the LED bulb of the present invention. The light fitting is engagingly connected to at least three of the plurality of faces, as show in FIG. 8E for example, which illustrates three faces of the folded PCB coupled to an Edison screw light fitting. FIG. 4c illustrates five faces of the folded PCB coupled to an Edison screw light fitting. At least three of the PCB faces must each have a set of edge teeth to complementarily engage internal components of the light fitting. Other light fittings are contemplated, so long as the part of the PCB which connects thereto can be shaped accordingly. An electrical connection of course must be made between the light fitting and the PCB, such as by exposing or coupling part of the internal conductive layer at a contact point with the light fitting. As such, the at least one of the faces which is complementarily engaged with the internal components of the light fitting also electronically engages with internal components of the light fitting.

The parts of the PCB which mechanically engage with the internal components of the light fitting can be further secured to the light fitting to reinforce the mechanical engagement, such as with adhesive. This will also reduce or prevent tampering of the bulb including by users intent on disassembling the LED bulb.

After the PCB of the invention is folded, each edge of the PCB of the LED bulb 100 should be secured fixedly. Referring to FIG. 2, in one embodiment of the invention, a plurality of interlocking edges 160 are formed on the PCB, that is to say, after folding the PCB along bends 140, each edge of the 3-D shaped LED body may be locked or secured by the pre-formed interlocking edges 160, such that each edge of the resulting LED bulb 100 may not be separated.

FIG. 4a-d illustrate various views of an assembled LED light in one embodiment of the present invention, wherein threads 170 complement the inner threads of an Edison fitting. The top most shape shown in FIG. 4d comprises an assembly of shapes S11, S12, S13, S14 and S15. Each shape of this polyhedron bulb comprises three LEDs, each of which protrudes out of the PCB, as well as 10 ventilation holes 150.

FIG. 5a-d illustrate various views of another assembled LED light embodiment, wherein each shape of the polyhedron bulb comprises three LEDs, each of which protrudes out of the PCB, but no ventilation holes.

FIGS. 6a-d illustrate various views of another assembled LED light embodiment, wherein each shape of the polyhedron bulb comprises one or more LEDs which do not protrude noticeably out of the PCB, and no ventilation holes. FIGS. 4-6 illustrate embodiments with Edison fittings.

FIGS. 7a-d illustrate various views of another assembled LED light embodiment, wherein each shape of the polyhedron bulb comprises three LEDs which do not protrude out of the PCB, and no ventilation holes. These figures illustrate the LED light with a bayonet mount fitting. Other fittings with the present invention are contemplated.

Assembly of the bulb depends on the configuration of the PCB template. Two examples are provided for illustration purposes. Other PCB templates and assembly methods are contemplated.

Assembly Example 1: Bottom to Top

Figure 12:
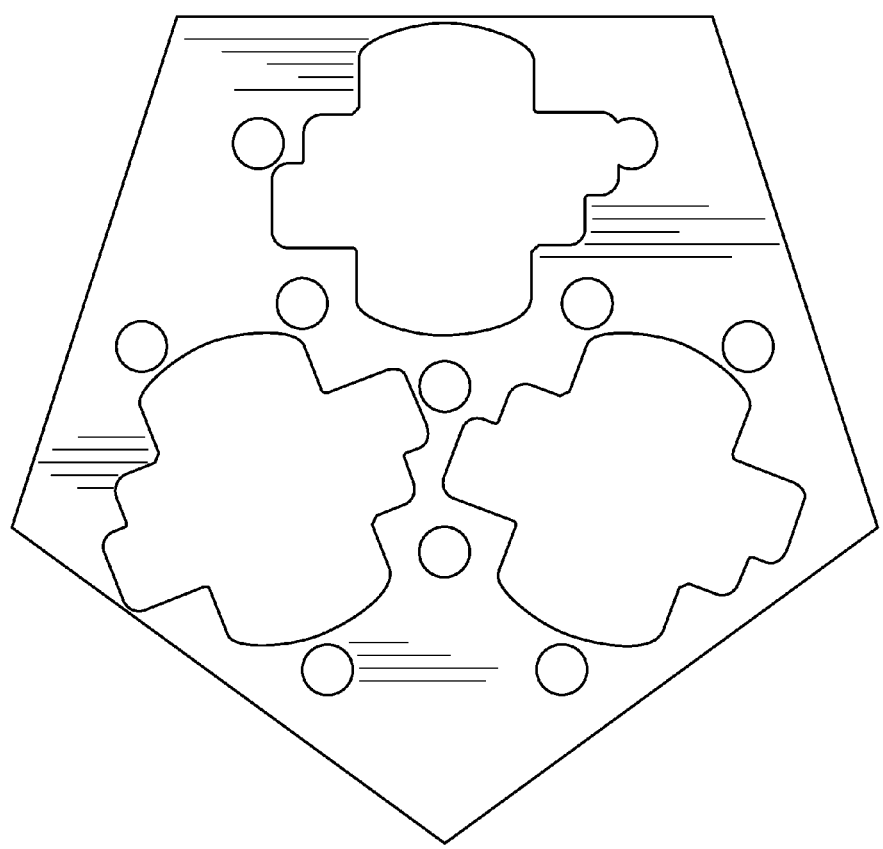
FIG. 12 is a schematic view of a non-energized template tool for assembling the three-dimensional bulb, according to one embodiment of the present invention.
Figure 13A:
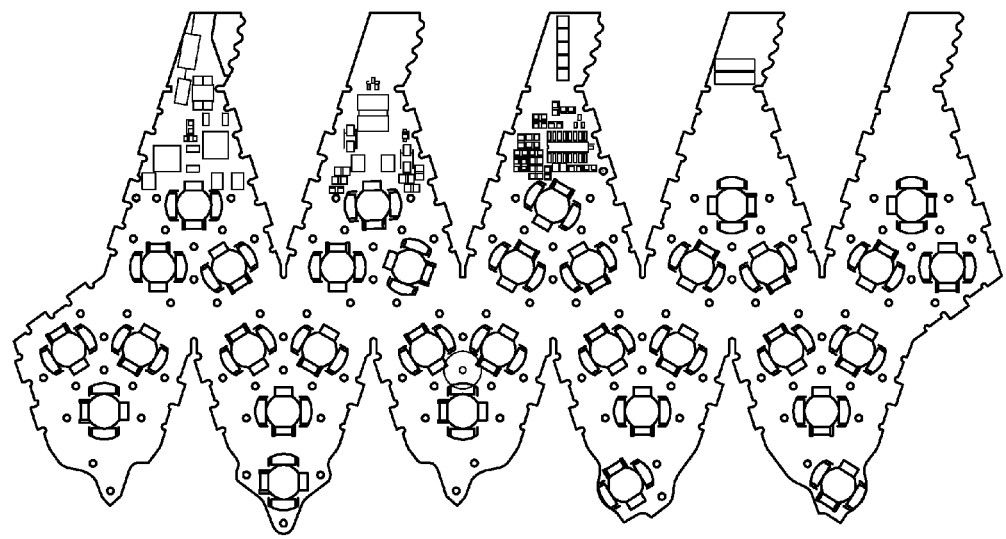
FIGS. 13A-13C are schematic views of assembly steps of the PCB template of FIG. 2 into the three-dimensional bulb, according to one embodiment of the present invention.
Figure 13B:
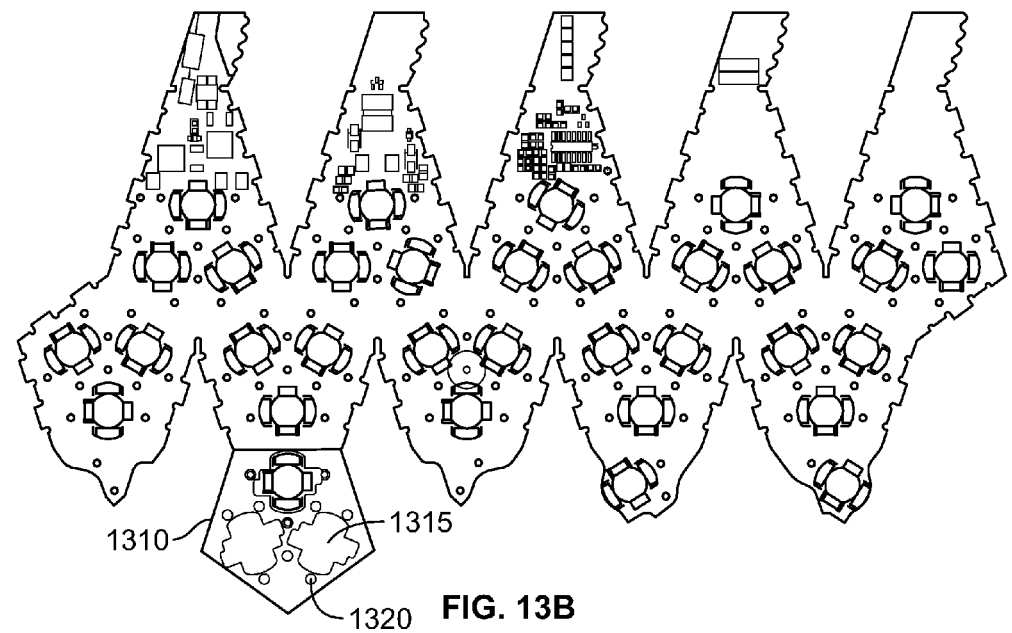

The following assembly instructions are with reference to the PCB template of FIG. 13A. The assembly can be referred to as a "bottom to top assembly" as the top face is the final part to be assembled. For ease of illustration, all the internal components are not illustrated when teaching the assembly. A non-energized plate, such as a non-conductive PCB template 1310 of FIG. 12 is used, along with a light fitting and instant glue. 3M glue was used in one embodiment. Using instant glue on the joining surfaces, attach the non-conductive plate 1310 to the PCB structure as shown in FIG. 13B. With reference to FIG. 2, non-conductive plate 1310 is adhered onto shape S12 in this example.

Figure 13C:
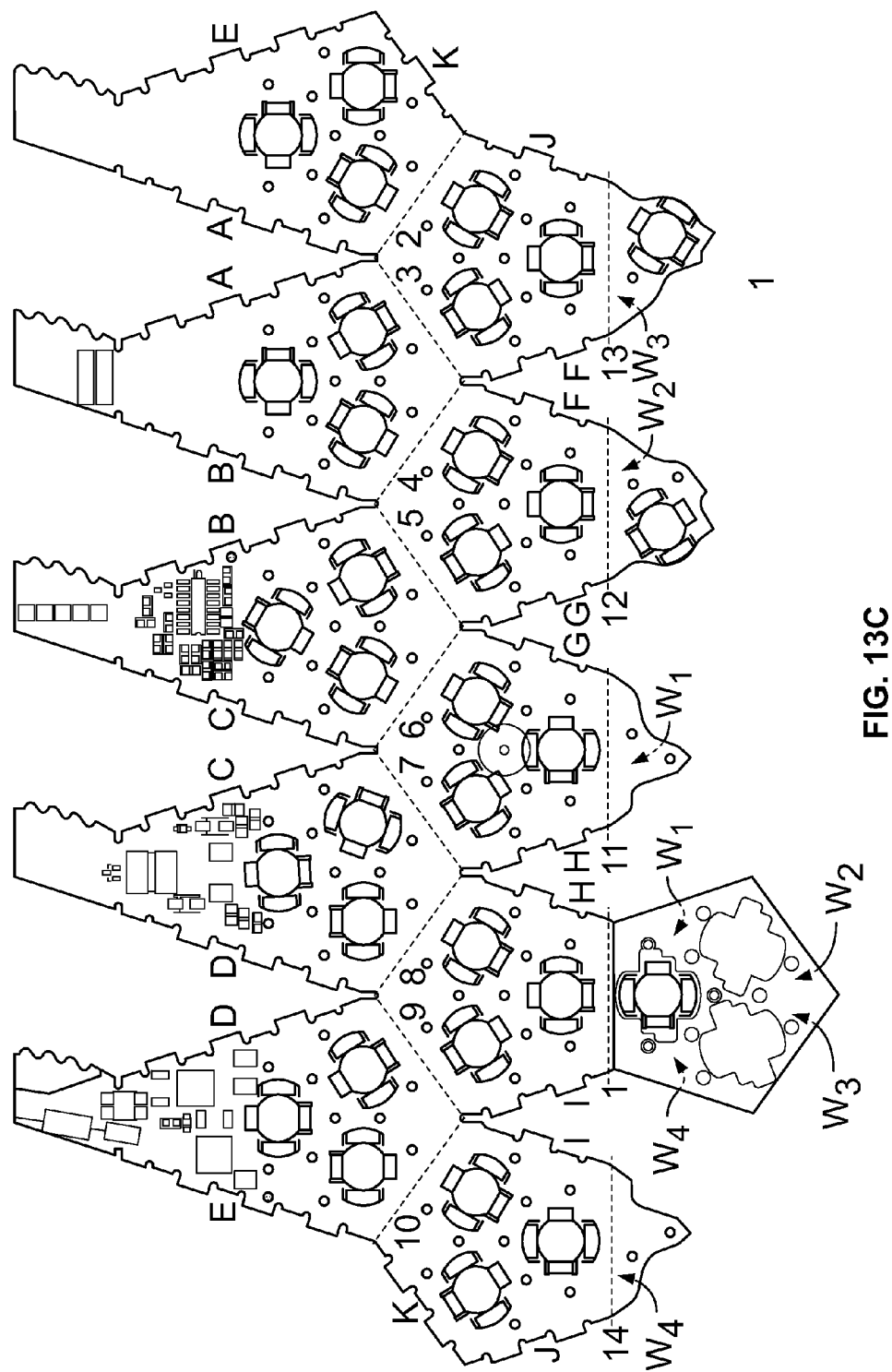

FIG. 13C illustrates the steps of assembly along with these instructions. FIG. 13C shows fold lines, edges, and surfaces. Starting with an angle of 180 degrees between surfaces, fold about 63 degrees along bending line 1 to reach an angle of about 117 degrees between surfaces. Make similar folds at bending lines 2, 3, 4, 5, 6, 7, 8, and 9. Align and lock the interlocking edge teeth A-A, B-B, C-C, D-D, E-E, F-F, G-G, and H-H. The tails shapes S2, S4, S6, S8 and S10 (from FIG. 2) join together as the 3-D structure takes shape. Screw on light fitting, such as an Edison screw socket base.

Apply instant glue to non-conductive plate 1310 at location $W_1$. Note that from the perspective shown in FIG. 13C, the glue is applied to the underside. While the glue is still fresh, fold about 63 degrees along bending line 11 and bring two surfaces $W_1$ together, namely surface $W_1$ of non-conductive plate 1310 and surface $W_1$ of shape S13. Instant glue bonds these surfaces together.

Next, apply instant glue to non-conductive plate 1310 at location $W_2$. Note that from the perspective shown in FIG. 13C, the glue is applied to the underside. While the glue is still fresh, fold about 63 degrees along bending line 12 and bring the two surfaces $W_2$ together, similar to the step explained above.

In a similar manner, apply instant glue to non-conductive plate 1310 at location $W_3$ and fold about 63 degrees along bending line 13, then bring two surfaces $W_3$ together. Then, fold about 63 degrees along bending line 10.

Next, align and lock the interlocking edge teeth I-I, J-J, and K-K. When edge teeth J-J and K-K are locked, the polyhedron is formed. Apply instant glue to non-conductive plate 1310 at location $W_4$. Fold about 63 degrees along bending line 14 and bring two surfaces $W_4$ together to complete assembly. Finally, any excess or visible glue residue is cleaned.

Assembly Example 2: Top to Bottom

The following assembly instructions are with reference to the PCB template of FIG. 10. The assembly can be referred to as a "top to bottom assembly" as the final assembly step occurs at the bottom when the light fitting is attached. For ease of illustration, all the internal components are not illustrated when teaching the assembly.

In this embodiment, a non-conductive plate such as the non-conductive plate 1310 of FIG. 12 is not required. In addition to the star-shaped PCB template, a light fitting and instant glue are required.

Figure 14:
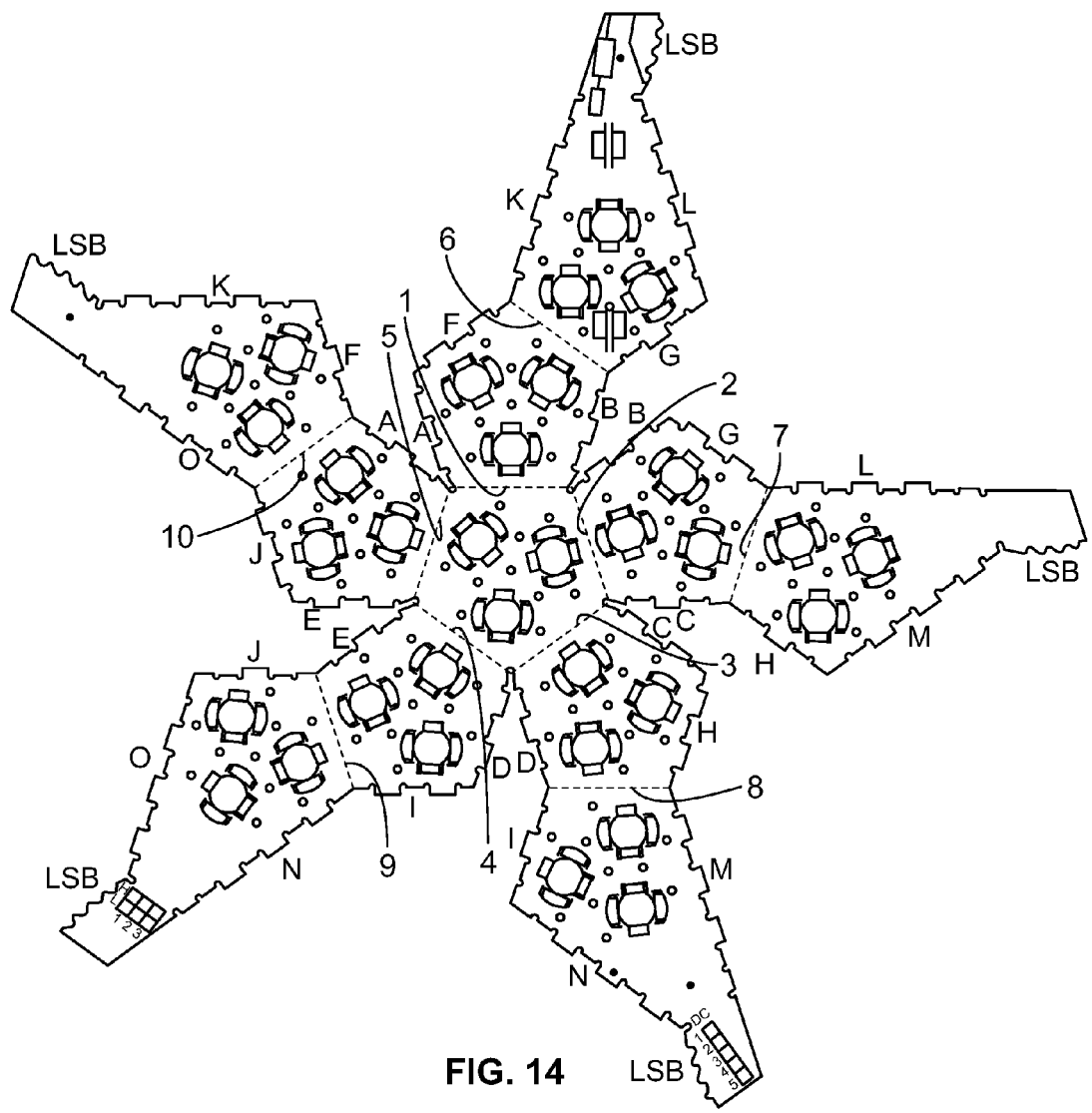
FIG. 14 is a schematic view of assembly steps of the PCB template of FIG. 10 into the three-dimensional bulb, according to another embodiment of the present invention.

FIG. 14 illustrates the steps of assembly along with these instructions. FIG. 14 shows fold lines, interlocking edge teeth, and screw threads. Starting with an angle of 180 degrees between surfaces, fold about 63 degrees along bending line 1 to reach an angle of about 117 degrees between surfaces. Make similar folds at bending lines 2, 3, 4 and 5. 3. Align and lock the interlocking edges A, B, C, D, and E. Fold about 63 degrees along bending lines 6, 7, 8, 9, and 10 so that each bend reaches an angle of about 117 degrees between surfaces. Next, align and lock the interlocking edge teeth F-F, G-G, H-G, I-I, J-J, K-K, L-L, M-M, N-N, and O-O. Finally, screw on light fitting, such as an Edison screw socket base at locations LSB with clockwise rotation. The light bulb is now fully folded and enclosed.

It will be appreciated that the second assembly method can be faster and less cumbersome than the first assembly method. Other assembly methods and PCB template configurations are contemplated. As such, the example assembly methods are not be considered exhaustive.

In one embodiment, the light fitting is an Edison screw and the light is sized to be about 3 inches wide at its widest point and about 4.3 inches in length from the PCB to the end of the fitting, the Edison screw having a base of about 1 inch in diameter. The LED light of this embodiment weighs about 85-100 g.

Efficiencies

In one embodiment, when a power source is applied to the circuit, about 10 W power is consumed, the current is down driven to 95 mA and the LEDs are illuminated, yielding a light output of about 1,200 lm. In another embodiment, about 12 W power is consumed, the current is down driven to 117 mA, yielding a light output ranging from 1,600 to 1,800 lm depending on the choice of LEDs. The LED light therefore has a measured efficiency of between 120-150 lm/W.

According to the present invention, the LED bulb 100 of the present invention is more energy efficient, has higher brightness and is less harmful to the environment than comparable lighting options.

In one embodiment of the present invention, light output testing result is to produce at least 1600 lumens while consuming 12 W of real power at a color temperature of 3500K and a color rendering index of 70.

In another embodiment of the invention, the LED bulb 100 of the present invention produces at least 1200 lumens while consuming 10 W of real power at a color temperature of 3500K and a color rendering index of 70.

In one embodiment, the power supply is configured to provide about 11.4 W of power to the plurality of LEDs, the power supply being about 95% efficient (ie: about 5% being lost as heat), the lost heat from the power supply being dissipated by the structural PCB shell.

In another embodiment, the power from the power supply drives each of the plurality of LEDs, each of the plurality of LEDs being about 30% efficient (ie: about 70% being lost as heat), at least a portion of the lost heat from each of the plurality of LEDs being dissipated inward by the structural PCB shell and outward to the environment.

The LED bulb 100 of the present invention revolutionizes the prior art understanding for manufacturing a light bulb, whist keeping manufacturing costs low.

While particular embodiments of the invention have been illustrated and described, it will be obvious to those skilled in the art that changes and modifications can be made without departing from the scope of the invention. It should be appreciated that all the embodiments of the present invention described above are illustrative only, and all the changes and modifications made by those skilled in the art are covered by the appended claims.

What is claimed is:

1. An LED light comprising:
   a structural shell comprising a PCB (polyhedron printed circuit board) folded into a three-dimensional shape, the three-dimensional shape comprising a plurality of faces and an open end; and
   a light fitting joined to the open end, the light fitting for removably coupling the LED light to a light fixture;
   wherein the PCB comprises: a plurality of LEDs mounted thereon, one or more of the plurality of faces comprising at least one of the plurality of LEDs, and a driver circuit, wherein the driver circuit electronically connects the plurality of LEDs to the light fitting;
   wherein a first face of the plurality of faces has a first set of edge teeth on at least part of a perimeter of the first face, and a second face of the plurality of faces has a second set of edge teeth on at least part of a perimeter of the second face, the second set of edge teeth configured to be complementary to and interlock with the first set of edge teeth.

2. The LED light according to claim 1, wherein the three-dimensional shape dissipates heat from inside the three-dimensional shape through the PCB.

3. The LED light according to claim 1, wherein each of the plurality of faces comprises an outer face and a corresponding inner face, the PCB comprising at least one outer non-conductive layer and at least one internal conductive layer.

4. The LED light according to claim 3, wherein a plurality of bending lines is cut partially, but not all the way, through the at least one outer non-conductive layer of the PCB, at a sufficient depth to allow partial bending of the PCB at one or more angles along the plurality of bending lines so as to facilitate folding of the PCB into a generally polyhedron shape, while maintaining the integrity of the at least one internal conductive layer.

5. The LED light according to claim 3, wherein the at least one internal conductive layer is copper.

6. The LED light according to claim 4, wherein the plurality of bending lines is cut by a laser cutting apparatus.

7. The LED light according to claim 4, wherein the one or more angles is within the range of 1 to 90 degrees.

8. The LED light according to claim 7, wherein the one or more angles is about 63 degrees.

9. The LED light according to claim 1, wherein at least part of a perimeter of the PCB is shaped to interlock at least two of the plurality of faces to each other.

10. An LED light comprising:
    a structural shell comprising a PCB (polyhedron printed circuit board) folded into a three-dimensional shape, the three-dimensional shape comprising a plurality of faces and an open end; and
    a light fitting joined to the open end, the light fitting for removably coupling the LED light to a light fixture;
    wherein the PCB comprises: a plurality of LEDs mounted thereon, one or more of the plurality of faces comprising at least one of the plurality of LEDs, and a driver circuit, wherein the driver circuit electronically connects the plurality of LEDs to the light fitting; and
    wherein at least three of the plurality of faces mechanically engage and are secured to internal components of the light fitting, said at least three of the plurality of faces each having a first, second and third set of edge teeth that interlock with each other.

11. The LED light according to claim 1, wherein the light fitting is chosen from the group consisting of a standard Edison screw, a bayonet mount and a wedge base.

12. The LED light according to claim 1, wherein one or more of the faces of the three-dimensional shape is a polygon chosen from the group consisting of a triangle, a quadrilateral, a pentagon and a hexagon.

13. The LED light according to claim 12, wherein a plurality of parts of the PCB are folded to complement each other without overlap and together assemble to form one face of the three-dimensional shape.

14. The LED light according to claim 13, wherein at least one of the plurality of parts of the PCB comprises one of the plurality of LEDs.

15. The LED light according to claim 10, wherein at least one of the plurality of faces mechanically engaged with the internal components of the light fitting also electronically engages with the internal components of the light fitting.

16. The LED light according to claim 10, wherein the at least three of the plurality of faces mechanically engage with and are secured to the internal components of the light fitting.

17. The LED light according to claim 16, wherein the mechanical engagement is further secured with adhesive.

18. The LED light according to claim 4, wherein three or more angles between any pair of adjacent faces are about the same.

19. The LED light according to claim 4, wherein the generally polyhedron shape comprises at least four faces and an open end.

20. The LED light according to claim 19, wherein the generally polyhedron shape comprises eleven faces and an open end.

21. The LED light according to claim 4, wherein the generally polyhedron shape is chosen from the group consisting of a Platonic solid and an irregular polyhedron.

22. The LED light according to claim 14, further comprising an additional non-conductive plate shaped and dimensioned to the assembled face, the plate adhered to the parts of the assembled face and comprising one or more holes configured to accept the one or more LEDs thereon.

23. The LED light according to claim 22, wherein the assembled face comprises an outer face and a corresponding inner face, the plate being adhered to the inner face.

24. The LED light according to claim 22, wherein the plate consists of non-energized PCB material.

25. The LED light according to claim 10, wherein one of the first or second set of edge teeth comprises on either side a milled or drilled portion comprising a cut into the perimeter of the PCB at about ninety degrees to the perimeter for at least about the thickness of the PCB, the cut then extending about ninety degrees parallel to the perimeter at about a width of the other of the second or first set of edge teeth, the cut then returning to the perimeter of the PCB at about ninety degrees.

26. The LED light according to claim 25, further comprising milled or drilled spaces cut out of the PCB at about the right angle junctions formed therein.

27. The LED light according to claim 1, comprising at least one LED on at least one face of the PCB.

28. The LED light according to claim 20, comprising three LEDs on each face of the PCB.

29. The LED light according to claim 11, wherein the light fitting is an Edison screw and the light is sized to be about 3 inches wide at its widest point and about 4.3 inches in length from the PCB to the end of the fitting, the Edison screw having a base of about 1 inch in diameter.

30. The LED light according to claim 29 weighing about 85 g.

31. The LED light according to claim 1, further comprising a temperature sensor electronically connected to the driver circuit and configured to sense a temperature condition within the three-dimensional shape.

32. An LED light, comprising:
a structural shell comprising a PCB (polyhedron printed circuit board) folded into a three-dimensional shape, the three-dimensional shape comprising a plurality of faces and an open end; and
a light fitting joined to the open end, the light fitting for removably coupling the LED light to a light fixture,
wherein the PCB comprises: a plurality of LEDs mounted thereon, one or more of the plurality of faces comprising at least one of the plurality of LEDs; a driver circuit; and
a pulse-width modulation controller IC (integrated circuit) electronically connected to the driver circuit for regulating current to the plurality of LEDs wherein the driver circuit electronically connects the plurality of LEDs to the light fitting.

* * * * *